US011530354B2

(12) United States Patent
Kim et al.

(10) Patent No.: US 11,530,354 B2
(45) Date of Patent: Dec. 20, 2022

(54) QUANTUM DOTS, COMPOSITIONS OR COMPOSITES INCLUDING THE SAME, PATTERNIZED LAYER, AND DISPLAY DEVICE INCLUDING THE SAME

(71) Applicant: Samsung Display Co., Ltd., Yongin-si (KR)

(72) Inventors: Taekhoon Kim, Hwaseong-si (KR); Shin Ae Jun, Seongnam-si (KR); Yong Wook Kim, Yongin-si (KR); Tae Gon Kim, Hwaseong-si (KR); Garam Park, Seoul (KR)

(73) Assignee: SAMSUNG DISPLAY CO., LTD., Gyeonggi-Do (KR)

( * ) Notice: Subject to any disclaimer, the term of this patent is extended or adjusted under 35 U.S.C. 154(b) by 209 days.

(21) Appl. No.: 16/950,994

(22) Filed: Nov. 18, 2020

(65) Prior Publication Data
US 2021/0147749 A1 May 20, 2021

(30) Foreign Application Priority Data
Nov. 18, 2019 (KR) .................. 10-2019-0147642

(51) Int. Cl.
*C09K 11/88* (2006.01)
*C09K 11/08* (2006.01)
(Continued)

(52) U.S. Cl.
CPC .......... *C09K 11/883* (2013.01); *C09K 11/025* (2013.01); *C09K 11/0883* (2013.01);
(Continued)

(58) Field of Classification Search
CPC . C09K 11/883; C09K 11/025; C09K 11/0883; C09K 11/70; C09K 11/02;
(Continued)

(56) References Cited

U.S. PATENT DOCUMENTS

2016/0096992 A1 4/2016 Guo et al.
2017/0306227 A1* 10/2017 Ippen ............... C09K 11/02
(Continued)

FOREIGN PATENT DOCUMENTS

JP 2018115315 A 7/2018
KR 20000012012 A 2/2000
(Continued)

OTHER PUBLICATIONS

Atom probe, Wikipedia, https://en.wikipedia.org/wiki/Atom_probe, Nov. 2, 2020, pp. 1-12.
(Continued)

*Primary Examiner* — Tracie Y Green
(74) *Attorney, Agent, or Firm* — Cantor Colburn LLP

(57) ABSTRACT

A quantum dot including a core including a first semiconductor nanocrystal including a Group III-V compound; and a semiconductor nanocrystal shell disposed on the core, the semiconductor nanocrystal shell including zinc, tellurium, and selenium, wherein the quantum dot does not include cadmium, and the semiconductor nanocrystal shell has a mole ratio of tellurium to selenium of less than about 0.025:1, a composition including the quantum dot, a quantum dot-polymer composite, a patterned layer including the composite, and an electronic device including the patterned layer.

26 Claims, 8 Drawing Sheets

(51) Int. Cl.
*C09K 11/02* (2006.01)
*H01L 27/32* (2006.01)
*G02F 1/13357* (2006.01)
*B82Y 20/00* (2011.01)
*B82Y 40/00* (2011.01)

(52) U.S. Cl.
CPC ............ *H01L 27/322* (2013.01); *B82Y 20/00* (2013.01); *B82Y 40/00* (2013.01); *G02F 1/133617* (2013.01)

(58) Field of Classification Search
CPC ... C09K 11/565; H01L 27/322; H01L 51/502; H01L 51/50; B82Y 20/00; B82Y 40/00; G02F 1/133617; G02F 1/133509; C08F 2/44; C08K 3/22; C08K 5/37
See application file for complete search history.

(56) References Cited

U.S. PATENT DOCUMENTS

| | | | |
|---|---|---|---|
| 2018/0119007 A1 | 5/2018 | Ippen et al. | |
| 2018/0327665 A1* | 11/2018 | Lee | C09K 11/02 |
| 2019/0280231 A1* | 9/2019 | Kim | H01L 51/5092 |
| 2019/0348623 A1* | 11/2019 | Dohner | H01B 1/08 |
| 2022/0119707 A1* | 4/2022 | Hwang | C09K 11/567 |
| 2022/0204843 A1* | 6/2022 | Jung | C09K 11/883 |
| 2022/0246804 A1* | 8/2022 | Park | C09K 11/025 |

FOREIGN PATENT DOCUMENTS

| | | |
|---|---|---|
| KR | 20070025989 A | 3/2007 |
| KR | 20080062162 A | 7/2008 |
| KR | 20180013801 A | 2/2018 |

OTHER PUBLICATIONS

David A. Browne et al., "Electron transport in unipolar InGaN/GaN multiple quantum well structures grown by NH3 molecular beam epitaxy," Journal of Applied Physics, May 8, 2015, pp. 185703-1-185703-9, vol. 117, Issue 185703.

Hiroshi Asano et al., "Design of cadmium-free colloidal II-VI semiconductor quantum dots exhibiting RGB emission," AIP Advances, Apr. 20, 2017, pp. 045309-1-045309-7, vol. 7.

Kiran G Sonawane et al., "A case study: Te in ZnSe and Mn-doped ZnSe quantum dots," Nanotechnology, Jun. 27, 2011, pp. 1-7, vol. 22.

Matthias Strassburg et al., "Growth and p-type doping of ZnSeTe on InP," Journal of Crystal Growth, 2003, pp. 50-55, vol. 248.

Nathalie Claes et al., "Characterization of Janus gold nanoparticles obtained via spontaneous binary polymer shell segregation," European Microscopy Congress, Dec. 20, 2020, pp. 690-691.

Vladimir Lesnyak et al., "Colloidal semiconductor nanocrystals: the aqueous approach," Chem Soc Rev, The Royal Society of Chemistry, Nov. 20, 2012, pp. 2905-2929, vol. 42.

Yongsoo Yang et al., "Deciphering chemical order/disorder and material properties at the single-atom level," Nature, Feb. 2, 2017, pp. 75-79, vol. 542.

\* cited by examiner

Pattern Preparation by using a photoresist

Repeating the Patterning Process three times

QUANTUM DOTS, COMPOSITIONS OR COMPOSITES INCLUDING THE SAME, PATTERNIZED LAYER, AND DISPLAY DEVICE INCLUDING THE SAME

CROSS-REFERENCE TO RELATED APPLICATION

This application claims priority to and the benefit of Korean Patent Application No. 10-2019-0147642 filed in the Korean Intellectual Property Office on Nov. 18, 2019, and all the benefits accruing therefrom under 35 U.S.C. § 119, the content of which in its entirety is herein incorporated by reference.

BACKGROUND

1. Field

Quantum dots, compositions or composites including the same, patterned layers, and display devices including the same are disclosed.

2. Description of the Related Art

Unlike bulk materials, in case of the nanoparticles, some physical characteristics (e.g., bandgap energies and melting points), which are intrinsic for the bulk materials, may be controlled by changing a particle size of the nanoparticles. For example, a semiconductor nanocrystal particle also known as a quantum dot is a nano-sized crystalline material. Such a semiconductor nanocrystal particle has a relatively small size, has a large surface area per unit volume, and exhibits a quantum confinement effect, showing properties different from those of a bulk material having the same composition. The quantum dot may absorb light from an excitation source to be excited and may emit energy corresponding to a bandgap energy of the quantum dot. From an environmental point of view, it is desirable to develop a cadmium-free quantum dot capable of exhibiting improved luminescence properties.

SUMMARY

In an embodiment, provided is a cadmium-free quantum dot capable of exhibiting improved luminescence properties and improved stability.

An embodiment provides a composition including the cadmium-free quantum dot.

An embodiment provides a quantum dot-polymer composite including the cadmium-free quantum dot.

An embodiment provides a patterned layer including the cadmium-free quantum dot or the quantum dot-polymer composite.

An embodiment provides an electronic device including the quantum dot-polymer composite or the patterned layer.

In an embodiment, a quantum dot includes a core including a first semiconductor nanocrystal including a Group III-V compound and a semiconductor nanocrystal shell disposed on the core, the semiconductor nanocrystal shell including zinc, tellurium, and selenium, wherein the quantum dot does not include cadmium and the semiconductor nanocrystal shell has a mole ratio of tellurium to selenium of less than about 0.025:1.

The semiconductor nanocrystal shell may have a mole ratio of tellurium to selenium of less than equal to about 0.02:1.

The semiconductor nanocrystal shell may have a mole ratio of tellurium to selenium of greater than or equal to about 0.005:1.

The semiconductor nanocrystal shell may have a composition that changes in a radial direction.

The semiconductor nanocrystal shell may include a first layer disposed directly on the core, and an outer layer disposed on the first layer, wherein the first layer may include a second semiconductor nanocrystal and the outer layer may have a different composition from semiconductor nanocrystal.

The second semiconductor nanocrystal may include zinc and selenium, and the outer layer may include zinc, and sulfur, selenium, or a combination thereof.

The second semiconductor nanocrystal may further include tellurium, the outer layer may include sulfur, a concentration of tellurium in the semiconductor nanocrystal shell may decrease in a direction toward the surface of the quantum dot, and a concentration of sulfur may increase in a direction toward the surface of the quantum dot.

The outer layer may include a first outer layer disposed directly on the first layer, and an outermost layer of the quantum dot, wherein the first outer layer may include a third semiconductor nanocrystal including zinc and selenium, and the outermost layer may include a fourth semiconductor nanocrystal including zinc and sulfur and no selenium.

The third semiconductor nanocrystal may further include tellurium.

The core may include indium and phosphorus.

The core may further include zinc.

The quantum dot may have a photoluminescence emission peak wavelength in a range of about 500 nanometers (nm) to about 550 nm, and a mole ratio of tellurium to indium may be greater than or equal to about 0.1:1.

A quantum efficiency of the quantum dot may be greater than or equal to about 58% and a full width at half maximum (FWHM) of a photoluminescence emission peak of the quantum dot may be less than or equal to about 45 nm.

The quantum dot may have a photoluminescence emission peak wavelength in the range of about 600 nm to about 650 nm and a mole ratio of tellurium to indium may be greater than or equal to about 0.01:1.

A quantum efficiency of the quantum dot may be greater than or equal to about 70% and a full width at half maximum (FWHM) of a photoluminescence emission peak of the quantum dot may be less than about 45 nm.

The quantum dot may include RCOOH, RCOOCOR, $RNH_2$, $R_2NH$, $R_3N$, RSH, $R_3PO$, $R_3P$, ROH, RCOOR', $RPO(OH)_2$, $R_2POOH$ (wherein, R and R' are independently a substituted or unsubstituted C1 to C40 aliphatic hydrocarbon group, a substituted or unsubstituted C6 to C40 substituted or unsubstituted aromatic hydrocarbon group, or a combination thereof, provided that at least one of R is not hydrogen), or a combination thereof, on a surface thereof.

In an embodiment, the composition may include a plurality of aforementioned quantum dots, a dispersing agent, a polymerizable monomer including a carbon-carbon unsaturated bond, and an initiator.

The dispersing agent may be a carboxylic acid group-containing polymer, and the polymer may include a copolymer of a monomer combination including a first monomer including a carboxylic acid group and a carbon-carbon double bond, a second monomer including a carbon-carbon double bond and a hydrophobic moiety and not including a carboxylic acid group and optionally a third monomer including a carbon-carbon double bond and a hydrophilic moiety and not including a carboxylic acid group;

a multiple aromatic ring-containing polymer having a backbone structure in which two aromatic rings are bound to a quaternary carbon atom that is a constituent atom of another cyclic moiety in the main chain and including a carboxylic acid group (—COOH); or a combination thereof.

The composition may further include a multi-thiol compound including at least two thiol groups at a terminal end of the multi-thiol compound, metal oxide particulates, or a combination thereof.

The metal oxide particulates may include $TiO_2$, $SiO_2$, $BaTiO_3$, $Ba_2TiO_4$, ZnO, or a combination thereof.

The multi-thiol compound may include a compound represented by Chemical Formula 1:

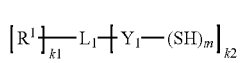

Chemical Formula 1

In Chemical Formula 1, $R^1$ is hydrogen; a substituted or unsubstituted C1 to C30 linear or branched alkyl group; a substituted or unsubstituted C6 to C30 aryl group; a substituted or unsubstituted C3 to C30 heteroaryl group; a substituted or unsubstituted C3 to C30 cycloalkyl group; a substituted or unsubstituted C3 to C30 heterocycloalkyl group; a C1 to C10 alkoxy group; a hydroxy group; —$NH_2$; a substituted or unsubstituted C1 to C30 amine group; an isocyanate group; a halogen; —ROR', wherein R is a substituted or unsubstituted C1 to C20 alkylene group and R' is hydrogen or a C1 to C20 linear or branched alkyl group; an acyl halide; —C(=O)OR', wherein R' is hydrogen or a C1 to C20 linear or branched alkyl group; —CN; —C(=O)ORR' or —C(=O)ONRR', wherein R and R' are independently hydrogen or a C1 to C20 linear or branched alkyl group, $L_1$ is a carbon atom, a substituted or unsubstituted C1 to C30 alkylene group, a substituted or unsubstituted C1 to C30 alkylene group wherein at least one methylene is replaced by a sulfonyl, a carbonyl, an ether, a sulfide, a sulfoxide, an ester, an amide, or a combination thereof, a substituted or unsubstituted C3 to C30 cycloalkylene group, a substituted or unsubstituted C6 to C30 arylene group, a substituted or unsubstituted C3 to C30 heteroarylene group, or a substituted or unsubstituted C3 to C30 heterocycloalkylene moiety, $Y_1$ is a single bond; a substituted or unsubstituted C1 to C30 alkylene group; a substituted or unsubstituted C2 to C30 alkenylene group; or a C1 to C30 alkylene group or a C2 to C30 alkenylene group wherein at least one methylene is replaced by a sulfonyl, a carbonyl, an ether, a sulfide, a sulfoxide, an ester (—C(=O)O—), an amide, an imine, or a combination thereof, m is an integer of 1 or greater, k1 is an integer of 0 or 1 or greater, k2 is an integer of 1 or greater, a sum of m and k2 is an integer of 3 or greater, m does not exceed a valence of $Y_1$, and a sum of k1 and k2 does not exceed a valence of $L_1$.

A quantum dot-polymer composite according to an embodiment includes a polymer matrix; and a plurality of the aforementioned cadmium-free quantum dots dispersed in the polymer matrix, wherein the polymer matrix includes a binder polymer, a polymerization product of a photopolymerizable monomer including at least one carbon-carbon double bond, and optionally a polymerization product between the photopolymerizable monomer and a multi-thiol compound including at least two thiol groups at a terminal end of the multi-thiol compound.

A patterned layer according to an embodiment includes a repeating section configured to emit light in a predetermined wavelength, wherein the repeating section includes the aforementioned quantum dot-polymer composite.

The repeating section includes a first section configured to emit red light, a second section configured to emit green light, or a combination thereof.

In an embodiment, a display device includes a light source and a light emitting element, wherein the light emitting element includes a substrate and the aforementioned quantum dot-polymer composite or patterned layer disposed on the substrate, and the light source is configured to provide the light emitting element with incident light.

The incident light may have a photoluminescence emission peak wavelength of about 440 nm to about 460 nm.

The quantum dot according to an embodiment may exhibit improved blue light absorption, and thus improved luminescence properties. The quantum dot according to an embodiment may be used in various display devices and biological labelling (e.g., bio sensor, bio imaging, etc.), a photo detector, a solar cell, a hybrid composite, and the like.

BRIEF DESCRIPTION OF THE DRAWINGS

The above and other advantages and features of this disclosure will become more apparent by describing in further detail exemplary embodiments thereof with reference to the accompanying drawings, in which.

DETAILED DESCRIPTION

Figure 1:
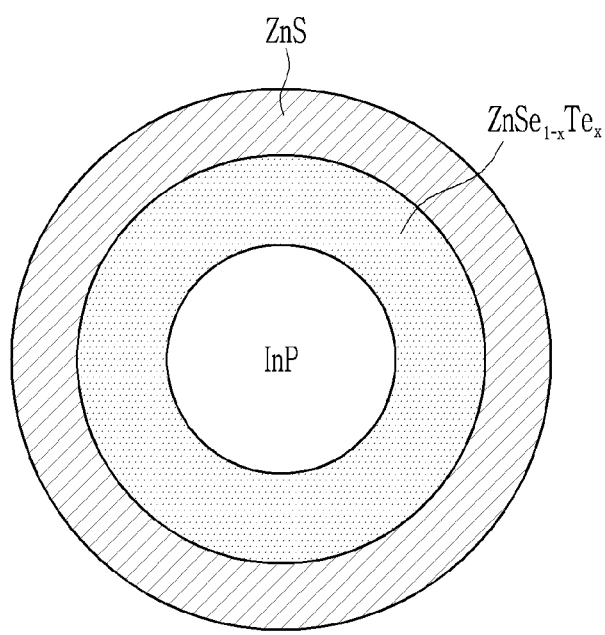
FIG. 1 is a schematic view showing a cross-section of a quantum dot according to an embodiment.

Advantages and characteristics of this disclosure, and a method for achieving the same, will become evident referring to the following embodiments together with the drawings attached hereto. However, the embodiments should not be construed as being limited to the embodiments set forth herein. If not defined otherwise, all terms (including technical and scientific terms) in the specification may be defined as commonly understood by one skilled in the art.

The terms defined in a generally-used dictionary may not be interpreted ideally or exaggeratedly unless clearly defined. In addition, unless explicitly described to the contrary, the word "comprise" and variations such as "comprises" or "comprising," or the word "include" and variations such as "includes" or "including," will be understood to imply the inclusion of stated elements but not the exclusion of any other elements.

Further, the singular includes the plural unless mentioned otherwise. As used herein, "a", "an," "the," and "at least one" do not denote a limitation of quantity, and are intended to include both the singular and plural, unless the context clearly indicates otherwise. For example, "an element" has the same meaning as "at least one element," unless the context clearly indicates otherwise. "At least one" is not to be construed as limiting "a" or "an." "Or" means "and/or." As used herein, the term "and/or" includes any and all combinations of one or more of the associated listed items.

In the drawings, the thickness of layers, films, panels, regions, etc., are exaggerated for clarity. Like reference numerals designate like elements throughout the specification.

It will be understood that when an element such as a layer, film, region, or substrate is referred to as being "on" another element, it can be directly on the other element or intervening elements may also be present. In contrast, when an element is referred to as being "directly on" another element, there are no intervening elements present.

It will be understood that, although the terms "first," "second," "third" etc. may be used herein to describe various elements, components, regions, layers and/or sections, these elements, components, regions, layers and/or sections should not be limited by these terms. These terms are only used to distinguish one element, component, region, layer, or section from another element, component, region, layer, or section. Thus, "a first element," "component," "region," "layer" or "section" discussed below could be termed a second element, component, region, layer, or section without departing from the teachings herein.

Furthermore, relative terms, such as "lower" or "bottom" and "upper" or "top," may be used herein to describe one element's relationship to another element as illustrated in the Figures. It will be understood that relative terms are intended to encompass different orientations of the device in addition to the orientation depicted in the Figures. For example, if the device in one of the figures is turned over, elements described as being on the "lower" side of other elements would then be oriented on "upper" sides of the other elements. The exemplary term "lower," can therefore, encompasses both an orientation of "lower" and "upper," depending on the particular orientation of the figure. Similarly, if the device in one of the figures is turned over, elements described as "below" or "beneath" other elements would then be oriented "above" the other elements. The exemplary terms "below" or "beneath" can, therefore, encompass both an orientation of above and below.

"About" as used herein is inclusive of the stated value and means within an acceptable range of deviation for the particular value as determined by one of ordinary skill in the art, considering the measurement in question and the error associated with measurement of the particular quantity (i.e., the limitations of the measurement system). For example, "about" can mean within one or more standard deviations, or within ±30%, 20%, 10% or 5% of the stated value.

Exemplary embodiments are described herein with reference to cross section illustrations that are schematic illustrations of idealized embodiments. As such, variations from the shapes of the illustrations as a result, for example, of manufacturing techniques and/or tolerances, are to be expected. Thus, embodiments described herein should not be construed as limited to the particular shapes of regions as illustrated herein but are to include deviations in shapes that result, for example, from manufacturing. For example, a region illustrated or described as flat may, typically, have rough and/or nonlinear features. Moreover, sharp angles that are illustrated may be rounded. Thus, the regions illustrated in the figures are schematic in nature and their shapes are not intended to illustrate the precise shape of a region and are not intended to limit the scope of the present claims.

As used herein, when a definition is not otherwise provided, "substituted" refers to replacement of hydrogen of a compound or a moiety by a substituent such as a C1 to C30 alkyl group, a C2 to C30 alkynyl group, a C6 to C30 aryl group, a C7 to C30 alkylaryl group, a C1 to C30 alkoxy group, a C1 to C30 heteroalkyl group, a C3 to C30 heteroalkylaryl group, a C3 to C30 cycloalkyl group, a C3 to C15 cycloalkenyl group, a C6 to C30 cycloalkynyl group, a C2 to C30 heterocycloalkyl group, a halogen (—F, —C, —Br or —I), a hydroxy group (—OH), a nitro group (—NO$_2$), a cyano group (—CN), an amino group (—NRR' wherein R and R' are independently hydrogen or a C1 to C6 alkyl group), an azido group (—N$_3$), an amidino group (—C(=NH)NH$_2$), a hydrazino group (—NHNH$_2$), a hydrazono group (=N(NH$_2$)), an aldehyde group (—C(=O)H), a carbamoyl group (—C(O)NH$_2$), a thiol group (—SH), an ester group (—C(=O)OR, wherein R is a C1 to C6 alkyl group or a C6 to C12 aryl group), a carboxyl group (—COOH) or a salt thereof (—C(=O)OM, wherein M is an organic or inorganic cation), a sulfonic acid group (—SO$_3$H) or a salt thereof (—SO$_3$M, wherein M is an organic or inorganic cation), a phosphoric acid group (—PO$_3$H$_2$) or a salt thereof (e.g., —PO$_3$MH or —PO$_3$M$_2$, wherein M is an organic or inorganic cation), or a combination thereof.

Herein, "hydrocarbon" refers to a group including carbon and hydrogen (e.g., an alkyl, alkenyl, alkynyl, or aryl group). The hydrocarbon group may be a group having a monovalence or greater formed by removal of one or more hydrogen atoms from, alkane, alkene, alkyne, or arene. In the hydrocarbon group, at least one methylene may be replaced by an oxide moiety, a carbonyl moiety, an ester moiety, —NH—, or a combination thereof.

Herein, "alkyl" refers to a linear or branched saturated monovalent hydrocarbon group (methyl, ethyl hexyl, etc.).

Herein, "alkenyl" refers to a linear or branched monovalent hydrocarbon group having one or more carbon-carbon double bond.

Herein, "alkynyl" refers to a linear or branched monovalent hydrocarbon group having one or more carbon-carbon triple bond.

Herein, "aryl" refers to a group formed by removal of at least one hydrogen from an aromatic group (e.g., a phenyl or naphthyl group).

Herein, "hetero" refers to one including 1 to 3 heteroatoms of N, O, S, Si, P, or a combination thereof.

Herein, "Group" refers to a group of Periodic Table.

Semiconductor nanocrystal particles also known as "quantum dots" are a (e.g., colloidal) crystalline material several nanometers in size. Such semiconductor nanocrystals particles may have a large surface area per a unit volume due to very small sizes and may exhibit different characteristics from bulk materials having the same composition due to a quantum confinement effect. Quantum dots may absorb light from an excitation source to be excited, and may emit energy corresponding to a bandgap energy of the quantum dot.

Quantum dots have a potential applicability to various devices (e.g., an electronic device) due to unique photoluminescence properties. Quantum dots having properties currently applicable to an electronic device and the like may be cadmium-based quantum dots. However, cadmium may cause a serious environment/health problem and thus is a restricted element. A cadmium-free quantum dot may be a Group III-V-based nanocrystal. Cadmium-free quantum dots may have poor luminescence properties (e.g., absorption for blue light) and stability compared with cadmium-based quantum dots. Blue light (e.g., at a wavelength of 450 nm) may be used as an energy excitation source of quantum dots, and an absorption intensity in blue light of cadmium-based quantum dots may be high, whereas an absorption intensity in blue light (e.g., wavelength of 450 nm) of cadmium-free quantum dots may not be high, which may lead to reduced luminance in the display device.

Since polarized light passed through a liquid crystal express a color while passing through an absorption type color filter, a liquid crystal display (LCD) (hereinafter, LCD) may have problems in that luminance may be deteriorated due to a narrow viewing angle and a low light transmittance of the absorption type color filter. A photoluminescent type color filter may overcome the technical limits of a display device including an absorption type color filter. A quantum dot-based color filter may use blue light (e.g., blue light of a 450 nm wavelength) instead of white light as an excitation light, and a color filter may be disposed in front of the device to convert the excitation light to the desirable light (e.g., green light/red light). Therefore, a quantum dot-based color filter may solve the technical problems of, for example, a liquid crystal display (e.g., narrow viewing angle and considerable light loss). Light with linearity may be scattered in all directions while passing through the liquid crystal layer, thus solving a viewing angle problem and avoiding an optical loss caused by an absorption type color filter.

However, when employing a quantum dot-based color filter, excitation light propagating in the forward direction of the device may become a serious technical problem and it may be desirable to block the excitation light propagating in the forward direction of the device. A cadmium-free quantum dot may not provide enough absorption to handle this problem. The introduction of a light scattering body for improving the absorption may lead to an increase in a production cost, and an increase in a solid content may cause additional problems in the production process. In order to block the excitation light, a blue light filter may cause an increase in a production cost and an increase in external light reflection, which may lead to optical loss, contrast deterioration, and a sharpness reduction of the display device.

A cadmium-free quantum dot (hereinafter, also referred to as a quantum dot) according to an embodiment does not include cadmium. The quantum dot includes a core including a first semiconductor nanocrystal including a Group III-V compound and a semiconductor nanocrystal shell disposed on the core and including zinc, selenium, and tellurium, wherein the semiconductor nanocrystal shell has a mole ratio of tellurium to selenium of less than about 0.025:1.

Tellurium is known to have higher absorption for blue light than sulfur or selenium among chalcogen elements. However, since tellurium has lower chemical stability than sulfur or selenium, when reacted with a metal such as zinc and the like to produce a semiconductor nanocrystal of ZnTe and the like, the semiconductor nanocrystal may be very vulnerable to oxidation compared with a semiconductor nanocrystal of ZnS or ZnSe obtained by reacting zinc with sulfur or zinc with selenium. Accordingly, a quantum dot including a high content of ZnTe may not exist physically and may not be chemically stably. Therefore, despite high blue light absorption, tellurium may not be desirable for use in preparing a quantum dot. In addition, in some technologies of preparing a quantum dot including tellurium in a core but not in a shell (JP2018115315A and the like) or in the shell (US20180119007A1), a content of tellurium in the shell may be about 2.5 mole percent (mol %), and the quantum dot may increase an absorption for blue light but change other photoluminescence properties, for example, a photoluminescence emission peak, or emission peak, wavelength and the like. Accordingly, development of a quantum dot effectively increasing an absorption for blue light without changing an intrinsic emission peak wavelength and thus improving luminescence properties without deteriorating structural stability is desired.

The present inventors have developed a quantum dot capable of effectively increasing an absorption for blue light without changing an intrinsic emission peak wavelength and thus improving photoluminescence properties of a display device including the quantum dot, and as a result, confirmed that a quantum dot having a core including a first semiconductor nanocrystal including a Group III-V compound and a semiconductor nanocrystal shell including zinc, selenium, and tellurium and disposed on the core, wherein a mole ratio of tellurium to selenium in the semiconductor nanocrystal shell is less than about 0.025:1, can solve the above problem.

For example, a mole ratio of tellurium to selenium in the semiconductor nanocrystal shell may be less than or equal to about 0.024:1, for example, less than or equal to about 0.023:1, less than or equal to about 0.022:1, less than or equal to about 0.021:1, less than or equal to about 0.020:1, less than or equal to about 0.019:1, less than or equal to about 0.018:1, less than or equal to about 0.017:1, less than or equal to about 0.016:1, less than or equal to about 0.015:1, less than or equal to about 0.014:1, less than or equal to about 0.013:1, less than or equal to about 0.012:1, less than or equal to about 0.011:1, less than or equal to about 0.010:1, less than or equal to about 0.009:1, less than or equal to about 0.008:1, less than or equal to about 0.007:1, less than or equal to about 0.006:1, or less than or equal to about 0.005:1. In addition, the mole ratio of tellurium to selenium may be greater than or equal to about 0.001:1, for example, greater than or equal to about 0.002:1, greater than or equal to about 0.003:1, greater than or equal to about 0.004:1, greater than or equal to about 0.005:1, greater than or equal to about 0.006:1, greater than or equal to about 0.007:1, greater than or equal to about 0.008:1, greater than or equal to about 0.009:1, greater than or equal to about 0.010:1, greater than or equal to about 0.011:1, greater than or equal to about 0.012:1, greater than or equal to about 0.013:1, greater than or equal to about 0.014:1, or greater than or equal to about 0.015:1, but is not limited thereto. When the mole ratio of tellurium to selenium in the shell is in the disclosed range, the quantum dot including the semiconductor nanocrystal shell has a high absorption for blue light but may not substantially change the photoluminescence emission peak wavelength.

In an embodiment, the semiconductor nanocrystal shell of the quantum dot may have a composition that changes in a radial direction.

The semiconductor nanocrystal shell includes a first layer disposed directly on the core, and an outer layer disposed on the first layer (e.g., a second layer, a third layer, etc.). The first layer may include a second semiconductor nanocrystal, and the outer layer (e.g., the second layer, the third layer, etc.) may include a semiconductor nanocrystal having a composition different from that of the second semiconductor nanocrystal. The first layer, the outer layer(s), or a combination thereof may further include tellurium (e.g., doped with tellurium).

FIG. 1 is a schematic view showing a cross-section of a quantum dot according to an embodiment. The quantum dot of FIG. 1 includes a core including a first semiconductor nanocrystal including InP and a semiconductor nanocrystal shell disposed on the core. The semiconductor nanocrystal shell includes a first layer disposed directly on the core, and an outer layer disposed on the first layer. The first layer of the quantum dot of FIG. 1 includes a $ZnSe_{1-x}Te_x$ semiconductor nanocrystal, wherein $0 \leq x \leq 1$, and the outer layer of the quantum dot of FIG. 1 includes a ZnS semiconductor nanocrystal.

In an embodiment, the second semiconductor nanocrystal may include zinc and selenium, and the outer layer may include a semiconductor nanocrystal including zinc and sulfur, selenium, or a combination thereof. In an embodiment, the second semiconductor nanocrystal may not include sulfur. For example, in an embodiment, the second semiconductor nanocrystal may not include ZnS. The second semiconductor nanocrystal may further include tellurium and the outer layer may include sulfur. A concentration of tellurium in the semiconductor nanocrystal shell may decrease in a direction toward the surface of the quantum dot and a concentration of sulfur may increase in a direction toward the surface of the quantum dot.

The outer layer may include a first outer layer disposed directly on the first layer and an outermost layer of the quantum dot. The first outer layer may include a third semiconductor nanocrystal including zinc and selenium, and the outermost layer may include a fourth semiconductor nanocrystal including zinc and sulfur. The outermost layer may be disposed directly on the first outer layer. A thickness of the second outermost layer may be appropriately determined. The third semiconductor nanocrystal may include ZnSe. In an embodiment the third semiconductor nanocrystal may not include sulfur. The fourth semiconductor nanocrystal may have a larger bandgap energy than the second semiconductor nanocrystal and the third semiconductor nanocrystal.

In an embodiment, the quantum dot may have a core-multi-layered shell structure having a core including indium phosphide, a first layer disposed on the core directly and including ZnSe and tellurium, and an outer layer disposed directly on the first layer and including ZnS.

The semiconductor nanocrystal shell of the quantum dot may have a composition change with a concentration gradient in which the concentration of sulfur to selenium gradually increases in a direction toward the surface of the quantum dot. The semiconductor nanocrystal shell of the quantum dot may have a composition change with a concentration gradient in which a ratio of selenium to sulfur gradually increases in a direction toward the surface of the quantum dot but then, gradually decreases with the ratio of sulfur gradually increasing. The semiconductor nanocrystal shell of the quantum dot may have a composition change with a concentration gradient in which the concentration of sulfur gradually increases in a direction toward the surface of the quantum dot compared with that of tellurium. The semiconductor nanocrystal shell of the quantum dot may have a composition change with a concentration gradient in which a ratio of tellurium to sulfur gradually increases in a direction toward the surface of the quantum dot but then, gradually decreases with the ratio of sulfur gradually increasing.

In an embodiment, the core of the quantum dot may include indium and phosphorus. In addition, in an embodiment, the core of the quantum dot may further include zinc.

The quantum dot may be a quantum dot having a photoluminescence emission peak wavelength in the range of about 500 nm to about 550 nm, that is, a quantum dot emitting green light. Herein, in the quantum dot, a mole ratio of tellurium to indium may be greater than or equal to about 0.1:1, for example, greater than or equal to about 0.12:1, greater than or equal to about 0.14:1, greater than or equal to about 0.16:1, greater than or equal to about 0.18:1, greater than or equal to about 0.19:1, greater than or equal to about 0.2:1, greater than or equal to about 0.21:1, greater than or equal to about 0.22:1, greater than or equal to about 0.23:1, greater than or equal to about 0.24:1, or greater than or equal to about 0.25:1, but is not limited thereto.

Measurement of the content of each component in the quantum dot may be confirmed by appropriate means such as for example, inductively coupled plasma atom emission spectrometry (ICP-AES).

In the UV-Vis absorption spectrum, the quantum dot may have an absorption at a wavelength of 450 nm relative to an absorption of the first absorption peak wavelength of greater than or equal to about 0.6:1. Herein, "the first absorption peak wavelength" refers to a main peak that appears first from the lowest energy region in the UV-Vis absorption spectrum.

Blue light (e.g., having a wavelength of 450 nm) is often used as an energy excitation source for quantum dots. In the case of cadmium-based quantum dots, the absorption intensity in such blue light is high. However, in the case of a cadmium-free quantum dot, for example, absorption intensity in blue light having a wavelength of 450 nm may not be high, which may lead to a decrease in luminance in a display device including quantum dots. The quantum dots according to an embodiment may exhibit a significantly improved level of an absorption for blue light as described herein, without including cadmium. For example, in a UV-Vis absorption spectrum, the quantum dot may have an absorption at a wavelength of 450 nm relative to an absorption of the first absorption peak wavelength of greater than or equal to about 0.61:1, greater than or equal to about 0.62:1, greater than or equal to about 0.63:1, greater than or equal to about 0.64:1, greater than or equal to about 0.65:1, greater than or equal to about 0.66:1, greater than or equal to about 0.67:1, greater than or equal to about 0.68:1, greater than or equal to about 0.69:1, greater than or equal to about 0.7:1, greater than or equal to about 0.71:1, greater than or equal to about 0.72:1, greater than or equal to about 0.73:1, greater than or equal to about 0.74:1, greater than or equal to about 0.75:1, or greater than or equal to about 0.76:1, but is not limited thereto.

The quantum dot emitting the green light may have quantum efficiency of greater than or equal to about 58%, and a full width at half maximum (FWHM) of the emission peak of less than or equal to about 45 nm. For example, the quantum dot may have quantum efficiency of greater than or equal to about 60%, for example, greater than or equal to about 63%, greater than or equal to about 65%, greater than or equal to about 67%, greater than or equal to about 70%, greater than or equal to about 73%, greater than or equal to about 75%, greater than or equal to about 77%, greater than or equal to about 80%, greater than or equal to about 81%, greater than or equal to about 82%, greater than or equal to about 83%, greater than or equal to about 84%, greater than or equal to about 85%, greater than or equal to about 86%, greater than or equal to about 87%, greater than or equal to about 88%, greater than or equal to about 89%, or greater than or equal to about 90%, but is not limited thereto. In addition, the full width at half maximum (FWHM) of the emission peak may be less than or equal to about 43 nm, for example, less than or equal to about 42 nm, less than or equal to about 41 nm, or less than or equal to about 40 nm, but is not limited thereto. That is, the quantum dot having high quantum efficiency and a low full width at half maximum (FWHM) may exhibit improved optical properties and high color purity.

In addition, the quantum dot may be a quantum dot having a peak emission wavelength of 600 nm to 650 nm, that is, a quantum dot that emits red light. Herein, in the quantum dot, a mole ratio of tellurium to indium may be greater than or equal to about 0.01:1, for example, 0.012:1, greater than or equal to about 0.014:1, greater than or equal to about 0.016:1, greater than or equal to about 0.018:1, greater than or equal to about 0.019:1, greater than or equal to about 0.020:1, greater than or equal to about 0.021:1, or greater than or equal to about 0.022:1, but is not limited thereto.

In the UV-Vis absorption spectrum of the quantum dot, an absorption at a wavelength of 450 nm relative to an absorption of the first absorption peak wavelength may be greater than or equal to about 1.1:1. For example, in the UV-Vis absorption spectrum of the quantum dot, the absorption at the wavelength of 450 nm relative to the absorption of the first absorption peak wavelength may be greater than or equal to about 1.11:1, greater than or equal to about 1.12:1, greater than or equal to about 1.13:1, greater than or equal to about 1.14:1, greater than or equal to about 1.15:1, greater than or equal to about 1.16:1, greater than or equal to about 1.17:1, greater than or equal to about 1.18:1, greater than or equal to about 1.19:1, greater than or equal to about 1.20:1, greater than or equal to about 1.21:1, greater than or equal to about 1.22:1, greater than or equal to about 1.23:1, greater than or equal to about 1.24:1, greater than or equal to about 1.25:1, or greater than or equal to about 1.26:1, but is not limited thereto.

The quantum dot emitting the red light may have quantum efficiency of greater than or equal to about 70%, and a full width at half maximum (FWHM) of the emission peak of less than or equal to about 45 nm. For example, the quantum dot may have quantum efficiency of greater than or equal to about 71%, for example, greater than or equal to about 73%, greater than or equal to about 75%, greater than or equal to about 77%, greater than or equal to about 80%, greater than or equal to about 82%, greater than or equal to about 85%, greater than or equal to about 86%, greater than or equal to about 87%, greater than or equal to about 88%, greater than or equal to about 89%, or greater than or equal to about 90%, but is not limited thereto. In addition, the full width at half maximum (FWHM) of the emission peak may be less than or equal to about 40 nm, for example, less than or equal to about 39 nm, less than or equal to about for example, 38 nm, less than or equal to about 37 nm, or less than or equal to about 36 nm, but is not limited thereto. That is, the quantum dot having high quantum efficiency and a low full width at half maximum (FWHM) may exhibit improved optical properties and high color purity.

The quantum dot of an embodiment may include an organic ligand that is RCOOH, RNH$_2$, R$_2$NH, R$_3$N, RSH, RH$_2$PO, R$_2$HPO, R$_3$PO, RH$_2$P, R$_2$HP, R$_3$P, ROH, RCOOR, RPO(OH)$_2$, RPOOH, RHPOOH, R$_2$POOH (wherein, R is the same or different and is independently a substituted or unsubstituted C1 to C40 aliphatic hydrocarbon (e.g., a C1 to C40 alkyl group, a C2 to C40 alkenyl group, or a C2 to C40 alkynyl group), a substituted or unsubstituted C6 to C40 aromatic hydrocarbon (e.g., a C6 to C20 aryl group), or a combination thereof, provided that at least one of R is not hydrogen), or a combination thereof, on the surface thereof. The organic ligand may coordinate with, e.g., bind to, the surface of the quantum dots, and may allow nanocrystals to be well dispersed in a solution in a production process of the quantum dot described herein, may affect luminescence and electrical properties of the quantum dots, or a combination thereof.

Examples of the organic ligand may include methane thiol, ethane thiol, propane thiol, butane thiol, pentane thiol, hexane thiol, octane thiol, dodecane thiol, hexadecane thiol, octadecane thiol, benzyl thiol; methane amine, ethane amine, propane amine, butyl amine, pentyl amine, hexyl amine, octyl amine, dodecyl amine, hexadecyl amine, octadecyl amine, dimethyl amine, diethyl amine, dipropyl amine; methanoic acid, ethanoic acid, propanoic acid, butanoic acid, pentanoic acid, hexanoic acid, heptanoic acid, octanoic acid, dodecanoic acid, hexadecanoic acid, octadecanoic acid, oleic acid, benzoic acid; a phosphine such as a substituted or unsubstituted methylphosphine (e.g., trimethylphosphine, methyldiphenylphosphine, etc.), a substituted or unsubstituted ethylphosphine (e.g., triethylphosphine, ethyldiphenylphosphine, etc.), a substituted or unsubstituted propylphosphine, a substituted or unsubstituted butylphosphine, a substituted or unsubstituted pentylphosphine, a substituted or unsubstituted octylphosphine (e.g., trioctylphosphine (TOP)), and the like; a phosphine oxide such as a substituted or unsubstituted methylphosphine oxide (e.g., trimethylphosphine oxide, methyldiphenylphosphine oxide, etc.), a substituted or unsubstituted ethylphosphine oxide (e.g., triethylphosphine oxide, ethyldiphenylphosphine oxide, etc.), a substituted or unsubstituted propylphosphine oxide, a substituted or unsubstituted butylphosphine oxide, a substituted or unsubstituted octylphosphine oxide (e.g., trioctylphosphine oxide (TOPO)), and the like; diphenylphosphine, diphenylphosphine oxide, triphenylphosphine, or triphenylphosphine oxide; phosphonic acid, and the like, but are not limited thereto. Two or more different organic ligands may be used. The organic ligand may be a mixture of carboxylic acid and amine.

The quantum dot according to an embodiment may be produced by a method of a quantum dot that includes preparing a core including a first semiconductor nanocrystal including a Group III-V compound (hereinafter, also referred to as a core); and reacting the core including the first semiconductor nanocrystal, and a zinc precursor, a selenium precursor, and a tellurium precursor in an organic solvent to form a semiconductor nanocrystal shell including zinc, selenium, and tellurium on the surface of the core, wherein the forming of the semiconductor nanocrystal shell including zinc, selenium, and tellurium on the surface of the core includes adjusting a mole ratio of tellurium to selenium in the semiconductor nanocrystal shell to be less than about 0.025:1.

The adjusting of the mole ratio of tellurium to selenium in the semiconductor nanocrystal shell to be less than about 0.025:1 may be controlled by adjusting a content, e.g., relative content, of the tellurium precursor to the selenium precursor in a process of adding precursor materials for forming the shell of the semiconductor nanocrystal on the core to react them. In addition, in the forming of the shell, the tellurium precursor may be simultaneously added with the zinc precursor and the selenium precursor and reacted or separately added thereto, after adding a part of the zinc precursor and the selenium precursor, and then, the rest, e.g., reminder, of the zinc precursor and the selenium precursor are added thereto, or after adding and reacting the tellurium precursor and the zinc precursor, the zinc precursor and the selenium precursor are added thereto and reacted. A mole ratio of tellurium to selenium may be controlled within the range to produce the quantum dot according to an embodiment.

In addition, forming an additional shell to the semiconductor may further include forming a semiconductor nanocrystal shell including zinc and sulfur on the semiconductor nanocrystal shell including zinc, selenium, and tellurium by reacting the zinc precursor and the sulfur precursor after forming the semiconductor nanocrystal shell including zinc, selenium, and tellurium on the surface of the core. In an embodiment, the selenium precursor, the tellurium precursor, or a combination thereof may not be added, and in an embodiment, the selenium precursor and the tellurium precursor are not added. Herein, the quantum dot may have a semiconductor nanocrystal shell including ZnS at the outermost, and when the quantum dot includes the ZnS semiconductor nanocrystal at the outermost, the quantum dot may be structurally more stable.

Hereinafter, types of the precursors are described as an example in which the core is based on indium and phosphorus, but are not limited thereto. The core may be commercially available or may be synthesized in any suitable method. A method of producing the core is not particularly limited but may include a method of producing an indium phosphide-based core. The core according to an embodiment may be formed in a hot injection method of injecting a phosphorus precursor in a state that a solution including a metal precursor such as an indium precursor and the like and if desired, the aforementioned organic ligand is heated at a high temperature (e.g., greater than or equal to about 200° C.).

Types of the indium precursor may be appropriately selected. Examples of the indium precursor may be trimethyl indium, indium carboxylate such as indium acetate, indium palmitate, indium stearate, and the like, indium hydroxide, indium chloride, indium oxide, indium nitrate, indium sulfate, or a combination thereof.

Types of the phosphorus precursor may be appropriately selected. Examples of the phosphorus precursor may be tris(trimethylsilyl)phosphine, tris(dimethylamino) phosphine, triethylphosphine, tributylphosphine, trioctylphosphine, triphenylphosphine, tricyclohexylphosphine, or a combination thereof.

When the core further includes zinc, the zinc precursor may include a Zn metal powder, ZnO, a alkylated Zn compound (e.g., a C2 to C30 dialkyl zinc such as diethyl zinc), a Zn alkoxide (e.g., zinc ethoxide), a Zn carboxylate (e.g., zinc acetate), Zn nitrate, Zn perchlorate, Zn sulfate, Zn acetylacetonate, a Zn halide (e.g., zinc chloride, etc.), Zn cyanide, Zn hydroxide, or a combination thereof. Examples of the zinc precursor may include dimethyl zinc, diethyl zinc, zinc acetate, zinc acetylacetonate, zinc iodide, zinc bromide, zinc chloride, zinc fluoride, zinc carbonate, zinc cyanide, zinc nitrate, zinc oxide, zinc peroxide, zinc perchlorate, zinc sulfate, or a combination thereof. The zinc precursor may also be used as a precursor of zinc included in the shell.

The selenium precursor may include selenium, selenium-trioctylphosphine (Se-TOP), selenium-tributylphosphine (Se-TBP), selenium-triphenylphosphine (Se-TPP), selenium-diphenylphosphine (Se-DPP), or a combination thereof, but is not limited thereto.

The tellurium precursor may include tellurium, tellurium-tributylphosphine (Te-TBP), tellurium-triphenylphosphine (Te-TPP), tellurium-diphenylphosphine (Te-DPP), tellurium-trioctylphosphine (Te-TOP), or a combination thereof, but is not limited thereto.

The sulfur precursor may include a sulfur powder, hexane thiol, octane thiol, decane thiol, dodecane thiol, hexadecane thiol, mercapto propyl silane, sulfur-trioctylphosphine (S-TOP), sulfur-tributylphosphine (S-TBP), sulfur-triphenylphosphine (S-TPP), sulfur-trioctylamine (S-TOA), bistrimethylsilyl sulfur, ammonium sulfide, sodium sulfide, or a combination thereof.

The organic solvent may be a C6 to C22 primary amine such as hexadecylamine, a C6 to C22 secondary amine such as dioctylamine, a C6 to C40 tertiary amine such as trioctylamine, a nitrogen-containing heterocyclic compound such as pyridine, a C6 to C40 olefin such as octadecene, a C6 to C40 aliphatic hydrocarbon such as hexadecane, octadecane, or squalane, an aromatic hydrocarbon substituted with a C6 to C30 alkyl group such as phenyldodecane, phenyltetradecane, or phenyl hexadecane, a primary, secondary, or tertiary phosphine substituted with a, e.g., at least one (e.g., 1, 2, or 3), C6 to C22 alkyl group (e.g., trioctylphosphine), phosphine oxide substituted with a, e.g., at least one (e.g., 1, 2, or 3), C6 to C22 alkyl group (e.g., trioctylphosphine oxide), a C12 to C22 aromatic ether such as phenyl ether or benzyl ether, or a combination thereof.

Reaction conditions such as a reaction temperature and a time for forming the shell may be appropriately selected taking into consideration the desired shell composition. In an embodiment, the solvent and optionally the organic ligand may be heated (or subjected to vacuum) to a predetermined temperature (e.g., greater than or equal to about 100° C.) under vacuum, and then heated again at a predetermined temperature (e.g., greater than or equal to 100° C.) under an inert gas atmosphere. Then, the core is added, and the shell precursors are sequentially or simultaneously added and reacted by heating at a predetermined reaction temperature. A mixture having a different ratio of the shell precursors may be sequentially added for a reaction time to form a shell (e.g., having a gradient or a multi-layer) having a desired composition. The reaction temperature for forming the shell may be greater than or equal to about 200° C., for example, greater than or equal to about 250° C., or greater than or equal to about 300° C., or greater than or equal to about 310° C. and less than or equal to about 330° C., for example, less than or equal to about 325° C.

In the reaction system, contents and concentrations of each precursor may be selected taking into consideration compositions of the core and shell and reactivity between precursors.

After completing the reaction, a nonsolvent is added to reaction products and nanocrystal particles coordinated to, e.g., with, the ligand compound may be separated. The nonsolvent may be a polar solvent that is miscible with the solvent used in the core formation reaction, shell formation reaction, or a combination thereof and may not be capable of dispersing the produced nanocrystals therein. The nonsolvent may be selected depending the solvent used in the reaction and may be for example acetone, ethanol, butanol, isopropanol, ethanediol, tetrahydrofuran (THF), dimethylsulfoxide (DMSO), diethyl ether, formaldehyde, acetaldehyde, ethylene glycol, a solvent having a similar solubility parameter to the foregoing solvents, or a combination thereof. The separation may be performed through a centrifugation, precipitation, chromatography, or distillation. The separated nanocrystals may be added to a washing solvent and washed, if desired. The washing solvent has no particular limit and may have a similar solubility parameter to that of the ligand and may, for example, include hexane, heptane, octane, chloroform, toluene, benzene, and the like.

The quantum dots of an embodiment may be non-dispersible or insoluble for water, the aforementioned non-solvents, or a combination thereof.

The quantum dots of an embodiment may be dispersed in the aforementioned organic solvent. In an embodiment, the aforementioned quantum dots may be dispersed in a C6 to C40 aliphatic hydrocarbon, a C6 to C40 substituted or unsubstituted aromatic hydrocarbon, or a combination thereof.

The quantum dots applied to a color filter may be provided in a form of a composite pattern which is dispersed in a host matrix (e.g., including a polymer, an inorganic material, or a combination thereof). The weight of quantum dots included in the composite may be limited for the various reasons in a process. The quantum dot according to an embodiment exhibits an increased absorption for blue light and thus may exhibit an improved blue absorption with the limited weight. A composition of an embodiment includes the aforementioned quantum dot and thus may provide a quantum dot pattern or a quantum dot-polymer composite pattern, and accordingly, the produced pattern may exhibit an improved absorption for blue light.

The composition of an embodiment may include (e.g., a plurality of) the aforementioned quantum dot(s); and a dispersing agent. The dispersing agent may include a carboxylic acid group-containing binder polymer. The composition may further include a photopolymerizable monomer including a carbon-carbon double bond, and optionally (thermal or photo) initiator. The composition may further include a solvent.

A content of the aforementioned quantum dots in the composition may be appropriately adjusted taking into consideration the desired end use (e.g., color filter, etc.). In an embodiment, the content of the quantum dots may be greater than or equal to about 1 weight percent (wt %), for example, greater than or equal to about 2 wt %, greater than or equal to about 3 wt %, greater than or equal to about 4 wt %, greater than or equal to about 5 wt %, greater than or equal to about 6 wt %, greater than or equal to about 7 wt %, greater than or equal to about 8 wt %, greater than or equal to about 9 wt %, greater than or equal to about 10 wt %, greater than or equal to about 15 wt %, greater than or equal to about 20 wt %, greater than or equal to about 25 wt %, greater than or equal to about 30 wt %, greater than or equal to about 35 wt %, or greater than or equal to about 40 wt %, based on a solid content of the composition. The content of the quantum dots may be less than or equal to about 70 wt %, for example, less than or equal to about 65 wt %, less than or equal to about 60 wt %, less than or equal to about 55 wt %, or less than or equal to about 50 wt %, based on a solid content.

The composition according to an embodiment may be used to produce a quantum dot-polymer composite pattern. The composition according to an embodiment may be a quantum dot-containing photoresist composition to which a photolithography method may be applied. The composition according to an embodiment may be an ink composition that may provide a pattern by printing (e.g., a droplet discharge method such as inkjet printing). The composition according to an embodiment may not include a conjugated polymer (except a cardo binder that will be described herein). The composition according to an embodiment may include a conjugated polymer. Herein, the conjugated polymer may refer to a polymer having a conjugation double bond in a main chain of the polymer (e.g., polyphenylenevinylene, etc.).

In the composition according to an embodiment, the dispersing agent that ensures dispersion of the quantum dot may be included. In an embodiment, the dispersing agent may be a binder polymer. The binder polymer may include a carboxylic acid group. The binder polymer may include a copolymer of a monomer mixture including a first monomer including a carboxylic acid group and a carbon-carbon double bond, a second monomer including a carbon-carbon double bond and a hydrophobic moiety and not including a carboxylic acid group, and optionally a third monomer including a carbon-carbon double bond and a hydrophilic moiety and not including a carboxylic acid group (hereinafter, referred to a carboxylic acid group-containing polymer);

a multiple aromatic ring-containing polymer having a backbone structure in which two aromatic rings are bound to a quaternary carbon atom that is a constituent atom of another cyclic moiety in the main chain and including a carboxylic acid group (—COOH) (hereinafter, a cardo binder); or a combination thereof.

The copolymer includes a first repeating unit derived from the first monomer and a second repeating unit derived from the second monomer, and optionally a third repeating unit derived from the third monomer.

Examples of the first monomer may include carbonic acid vinyl ester compounds such as acrylic acid, methacrylic acid, maleic acid, itaconic acid, fumaric acid, 3-butenoic acid, vinyl acetate, or vinyl benzoate, or a combination thereof, but are not limited thereto. Examples of the second monomer may be an alkenyl aromatic compound such as styrene, alpha-methyl styrene, vinyl toluene, or vinyl benzyl methyl ether; an unsaturated carbonic acid ester compound such as methyl acrylate, methyl methacrylate, ethyl acrylate, ethyl methacrylate, butyl acrylate, butyl methacrylate, benzyl acrylate, benzyl methacrylate, cyclohexyl acrylate, cyclohexyl methacrylate, phenyl acrylate, or phenyl methacrylate; an unsaturated carbonic acid amino alkyl ester compound such as 2-amino ethyl acrylate, 2-amino ethyl methacrylate, 2-dimethyl amino ethyl acrylate, or 2-dimethyl amino ethyl methacrylate; a maleimide such as N-phenyl maleimide, N-benzyl maleimide, N-alkyl maleimide; an unsaturated carbonic acid glycidyl ester compound such as glycidyl acrylate or glycidyl methacrylate; a vinyl cyanide compound such as acrylonitrile, methacrylonitrile; or an unsaturated amide compound such as acryl amide or meth-acryl amide, but are not limited thereto.

As the second monomer, two or more different compounds may be used. Specific examples of the third monomer may include 2-hydroxy ethyl acrylate, 2-hydroxy ethyl methacrylate, 2-hydroxy butyl acrylate, or 2-hydroxy butyl methacrylate, but are not limited thereto. As the third monomer, two or more different compounds may be used.

In the carboxylic acid group-containing polymer, each content of the first repeating unit, second repeating unit, or a combination thereof may independently be greater than or equal to about 10 mol %, for example, greater than or equal to about 15 mol %, greater than or equal to about 25 mol %, or greater than or equal to about 35 mol %. In the carboxyl group-containing binder, a content of the first repeating unit may be less than or equal to about 90 mol %, for example, less than or equal to about 89 mol %, less than or equal to about 80 mol %, less than or equal to about 70 mol %, less than or equal to about 60 mol %, less than or equal to about 50 mol %, less than or equal to about 40 mol %, less than or equal to about 35 mol %, or less than or equal to about 25 mol %. In the carboxylic acid group-containing polymer, a content of the third repeating unit may be greater than or equal to about 1 mol %, for example, greater than or equal to about 5 mol %, greater than or equal to about 10 mol %, or greater than or equal to about 15 mol %, if present. In the carboxylic acid group-containing polymer, the content of the third repeating unit may be less than or equal to about 30 mol %, for example, less than or equal to about 25 mol %, less than or equal to about 20 mol %, less than or equal to about 18 mol %, less than or equal to about 15 mol %, or less than or equal to about 10 mol %.

The carboxylic acid group-containing polymer may include a multiple aromatic ring-containing polymer. The multiple aromatic ring-containing polymer is known as a cardo binder resin and may commercially be available.

The carboxylic acid group-containing polymer may have an acid value of greater than or equal to about 50 milligrams of potassium hydroxide per gram (mg KOH/g). For example, the carboxylic acid group-containing polymer may have an acid value of greater than or equal to about 60 mg KOH/g, greater than or equal to about 70 mg KOH/g, 80 mg KOH/g, 90 mg KOH/g, 100 mg KOH/g, 110 mg KOH/g, greater than or equal to about 120 mg KOH/g, greater than or equal to about 125 mg KOH/g, or greater than or equal to about 130 mg KOH/g.

The acid value of the carboxylic acid group-containing polymer may be may be for example less than or equal to about 250 mg KOH/g, less than or equal to about for example, 240 mg KOH/g, less than or equal to about 230 mg KOH/g, less than or equal to about 220 mg KOH/g, less than or equal to about 210 mg KOH/g, less than or equal to about 200 mg KOH/g, less than or equal to about 190 mg KOH/g, less than or equal to about 180 mg KOH/g, or less than or equal to about 160 mg KOH/g, but is not limited thereto. The binder may have a weight average molecular weight of greater than or equal to about 1,000 grams per mole (g/mol), for example, greater than or equal to about 2,000 g/mol, greater than or equal to about 3,000 g/mol, or greater than or equal to about 5,000 g/mol. The binder may have a weight average molecular weight of less than or equal to about 100,000 g/mol, for example, less than or equal to about 50,000 g/mol.

In the composition, a content of the carboxylic acid group-containing polymer may be greater than or equal to about 0.5 wt %, for example, greater than or equal to about 1 wt %, greater than or equal to about 5 wt %, greater than or equal to about 10 wt %, greater than or equal to about 15 wt %, or greater than or equal to about 20 wt % based on a total weight of the composition, but is not limited thereto. The content of the carboxylic acid group-containing polymer may be less than or equal to about 35 wt %, for example, less than or equal to about 33 wt %, or less than or equal to about 30 wt % based on a total weight of the composition. Within the ranges, dispersibility of the quantum dot may be ensured. The content of the carboxylic acid group-containing polymer may be about 0.5 wt % to about 55 wt % based on a total weight of a solid of the composition.

In the composition, the polymerizable (e.g., photopolymerizable) monomer including the carbon-carbon double bond may include a (e.g., photopolymerizable) acryl-based monomer. The monomer may be a precursor for an insulating polymer. The acryl-based monomer may include alkyl (meth)acrylate, ethylene glycol di(meth)acrylate, triethylene glycol di(meth)acrylate, diethylene glycol di(meth)acrylate, 1,4-butanediol di(meth)acrylate, 1,6-hexanediol di(meth) acrylate, neopentyl glycol di(meth)acrylate, pentaerythritol di(meth)acrylate, pentaerythritol tri(meth)acrylate, pentaerythritol tetra(meth)acrylate, dipentaerythritol di(meth) acrylate, dipentaerythritol tri(meth)acrylate, dipentaerythritol penta(meth)acrylate, pentaerythritol hexa(meth)acrylate, bisphenol A di(meth)acrylate, bisphenol A epoxy acrylate, trimethylolpropane tri(meth)acrylate, ethylene glycol monomethyl ether (meth)acrylate, novolac epoxy (meth) acrylate, diethylene glycol di(meth)acrylate, triethylene glycol di(meth)acrylate, propylene glycol di(meth)acrylate, tris (meth)acryloyloxyethyl phosphate, or a combination thereof.

A content of the monomer may be greater than or equal to about 0.5 wt %, for example, greater than or equal to about 1 wt % or greater than or equal to about 2 wt % based on a total weight of the composition. The content of the photopolymerizable monomer may be less than or equal to about 30 wt %, less than or equal to about for example, 28 wt %, less than or equal to about 25 wt %, less than or equal to about 23 wt %, less than or equal to about 20 wt %, less than or equal to about 18 wt %, less than or equal to about 17 wt %, less than or equal to about 16 wt %, or less than or equal to about 15 wt % based on a total weight of the composition.

The initiator in the composition may be used for polymerization of the aforementioned monomers. The initiator is a compound accelerating a radical reaction (e.g., radical polymerization of monomer) by producing radical chemical species under a mild condition (e.g., by heat or light). The initiator may be a thermal initiator or a photoinitiator. The initiator may be a compound capable of initiating a radical polymerization of the aforementioned polymerizable acrylic monomer, a thiol compound (will be described herein), or a combination thereof by light. The type of the initiator is not particularly limited. The initiator may be a thermal initiator. The thermal initiator may include azobisisobutyronitrile, benzoyl peroxide, and the like, but is not limited thereto. The initiator may be a photoinitiator. The photoinitiator may include a triazine-based compound, an acetophenone compound, a benzophenone compound, a thioxanthone compound, a benzoin compound, an oxime ester compound, an aminoketone compound, a phosphine or phosphine oxide compound, a carbazole-based compound, a diketone compound, a sulfonium borate-based compound, a diazo-based compound, a biimidazole-based compound, or a combination thereof, but is not limited thereto.

In the composition, a content of the initiator may be appropriately adjusted taking into consideration types and contents of the polymerizable monomers. In an embodiment, the initiator may be used in an amount range of about 0.01 wt % to about 10 wt % based on a total weight of the composition, but is not limited thereto.

The composition may further include a (multi- or monofunctional) thiol compound including at least one thiol group at a terminal end of the multi-thiol compound, a metal oxide particulate, or a combination thereof.

The metal oxide particulate may include $TiO_2$, $SiO_2$, $BaTiO_3$, $Ba_2TiO_4$, ZnO, or a combination thereof. In the composition, a content of the metal oxide may be greater than or equal to about 1 wt % and less than or equal to about 15 wt %, less than or equal to about 10 wt %, or less than or equal to about 5 wt % based on a solid content of the composition. The metal oxide particulate may have an appropriately selected diameter without a particular limit. The diameter of the metal oxide particulate may be greater than or equal to about 100 nm, for example, greater than or equal to about 150 nm, or greater than or equal to about 200 nm and less than or equal to about 1,000 nm or less than or equal to about 800 nm.

The multi-thiol compound may include a compound represented by Chemical Formula 1:

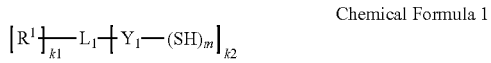

Chemical Formula 1 wherein, in Chemical Formula 1, $R^1$ is hydrogen; a substituted or unsubstituted C1 to C30 linear or branched alkyl group; a substituted or unsubstituted C6 to C30 aryl group; a substituted or unsubstituted C3 to C30 heteroaryl group; a substituted or unsubstituted C3 to C30 cycloalkyl group; a substituted or unsubstituted C3 to C30 heterocycloalkyl group; a C1 to C10 alkoxy group; a hydroxy group; —$NH_2$; a substituted or unsubstituted C1 to C30 amine group (—NRR', wherein R and R' are independently hydrogen or a C1 to C30 linear or branched alkyl group provided that both are not simultaneously hydrogen); an isocyanate group; a halogen; —ROR' (wherein R is a substituted or unsubstituted C1 to C20 alkylene group and R' is hydrogen or a C1 to C20 linear or branched alkyl group); an acyl halide (—RC(=O)X, wherein R is a substituted or unsubstituted alkylene group and X is a halogen); —C(=O) OR' (wherein R' is hydrogen or a C1 to C20 linear or branched alkyl group); —CN; —C(=O)ORR' or —C(=O) ONRR' (wherein R and R' are independently hydrogen or a C1 to C20 linear or branched alkyl group), L1 is a carbon atom, a substituted or unsubstituted C1 to C30 alkylene group, a substituted or unsubstituted C3 to C30 cycloalkylene group, a substituted or unsubstituted C6 to C30 arylene group, a substituted or unsubstituted C3 to C30 heterocycloalkylene group, or a substituted or unsubstituted C3 to C30 heteroarylene group, wherein methylene (—$CH_2$—) of the substituted C1 to C30 alkylene group may be replaced by sulfonyl (—$SO_2$—), carbonyl (CO), ether (—O—), sulfide (—S—), sulfoxide (—SO—), ester (—C (=O)O—), amide (—C(=O)NR—) (wherein R is hydrogen or a C1 to C10 alkyl group), or a combination thereof, $Y_1$ is a single bond; a substituted or unsubstituted C1 to C30 alkylene group; a substituted or unsubstituted C2 to C30 alkenylene group; or a C1 to C30 alkylene group or a C2 to C30 alkenylene group wherein at least one methylene (—$CH_2$—) is replaced by sulfonyl (—$S(=O)_2$—), carbonyl (—C(=O)—), ether (—O—), sulfide (—S—), sulfoxide (—S(=O)—), ester (—C(=O)O—), amide (—C(=O) NR—) (wherein R is hydrogen or a C1 to C10 linear or branched alkyl group), imine (—NR—) (wherein R is hydrogen or a C1 to C10 linear or branched alkyl group), or a combination thereof, m is an integer of 1 or greater, k1 is an integer of 0 or 1 or greater, k2 is an integer of 1 or greater, a sum of m and k2 is an integer of 3 or greater, when $Y_1$ is not a single bond, m does not exceed a valence of $Y_1$, and a sum of k1 and k2 does not exceed a valence of $L_1$.

The multi-thiol compound may be a dithiol compound, a trithiol compound, tetrathiol compound, or a combination thereof. For example, the multi-thiol compound may be glycol di-3-mercaptopropionate, glycol dimercapto acetate, trimethylolpropane tris(3-mercaptopropionate), pentaerythritol tetrakis(3-mercaptopropionate), pentaerythritoltetrakis (2-mercaptoacetate), 1,6-hexanedithiol, 1,3-propanedithiol, 1,2-ethanedithiol, polyethylene glycol dithiol including 1 to 10 ethylene glycol repeating units, or a combination thereof.

A content of the multi-thiol compound may be less than or equal to about 10 wt %, for example less than or equal to about 9 wt %, less than or equal to about 8 wt %, less than or equal to about 7 wt %, less than or equal to about 6 wt %, or less than or equal to about 5 wt % based on a total weight of the composition. The content of the multi-thiol compound may be greater than or equal to about 0.1 wt %, for example, greater than or equal to about 0.5 wt % or greater than or equal to about 1 wt % based on a total weight of the composition.

The composition may further include an organic solvent (or a liquid vehicle). Types of the usable organic solvent are not particularly limited. A type and an amount of the organic solvent may be appropriately determined by taking into consideration the main components (i.e., the quantum dot, the dispersing agent, the polymerizable monomer, the initiator, and if used, the thiol compound) and a type and an amount of an additive which is described herein. The composition may include a solvent in a residual amount except for a desired amount of the (non-volatile) solid. Examples of the solvent (or liquid vehicle) may include an ethylene glycol such as ethyl 3-ethoxy propionate, ethylene glycol, diethylene glycol, or polyethylene glycol; a glycol ether such as ethylene glycol monomethyl ether, ethylene glycol monoethyl ether, diethylene glycol monomethyl ether, ethylene glycol diethyl ether, or diethylene glycol dimethyl ether; a glycol ether acetate such as ethylene glycol acetate, ethylene glycol monoethyl ether acetate, diethylene glycol monoethyl ether acetate, or diethylene glycol monobutyl ether acetate; a propylene glycol such as propylene glycol; a propylene glycol ether such as propylene glycol monomethyl ether, propylene glycol monoethyl ether, propylene glycol monopropyl ether, propylenemonobutyl ether, propylene glycol dimethyl ether, dipropylene glycol dimethyl ether, propylene glycol diethyl ether, or dipropylene glycol diethyl ether; a propylene glycol ether acetate such as propylene glycol monomethyl ether acetate, or dipropylene glycol monoethyl ether acetate; an amide such as N-methylpyrrolidone, dimethyl formamide, or dimethyl acetamide; a ketone such as methylethylketone (MEK), methylisobutyl ketone (MIBK), or cyclohexanone; a petroleum such as toluene, xylene, or solvent naphtha; an ester such as ethyl acetate, butyl acetate, or ethyl lactate; an ether such as diethyl ether, dipropyl ether, or dibutyl ether; an aliphatic hydrocarbon, an alicyclic hydrocarbon, or an aromatic hydrocarbon, or a combination thereof.

If desired, the composition may further include various additives such as a light diffusing agent, a leveling agent, or a coupling agent in addition to the aforementioned components. A content of the additive is not particularly limited, and may be controlled within an appropriate range wherein the additive may not cause an adverse effect on preparation of the composition and production of the quantum dot-polymer composite and optionally a patterning of the composite.

If used, the additives may be used in a content of greater than or equal to about 0.1 wt %, for example, greater than or equal to about 0.5 wt %, greater than or equal to about 1 wt %, greater than or equal to about 2 wt %, or greater than or equal to about 5 wt % based on a total weight of the composition, but is not limited thereto. If used, the content of the additives may be less than or equal to about 20 wt %, for example, less than or equal to about 19 wt %, less than or equal to about 18 wt %, less than or equal to about 17 wt %, less than or equal to about 16 wt %, or less than or equal to about 15 wt % based on a total weight of the composition, but is not limited thereto.

The composition according to an embodiment may be produced by a method including: preparing quantum dot dispersion including the cadmium-free quantum dot, the dispersing agent, and the organic solvent; and mixing the quantum dot dispersion with the initiator; the polymerizable monomer (e.g., acryl-based monomer); optionally the thiol compound; optionally the metal oxide particulate, and optionally the aforementioned additives. Each aforementioned component may be mixed sequentially or simultaneously, but mixing orders are not particularly limited.

The composition may provide a quantum dot-polymer composite by a (e.g., radical) polymerization.

Accordingly, in an embodiment, the quantum dot-polymer composite includes a polymer matrix; and the cadmium-free quantum dots dispersed in the polymer matrix.

The polymer matrix may include a dispersing agent, for example, the aforementioned carboxylic acid group-containing polymer, a polymerization product of polymerizable monomers having at least one, for example, at least two, at least three, at least four, or at least five carbon-carbon unsaturated bonds, and optionally a polymerization product of the polymerizable monomer and the multi-thiol compound including at least two thiol groups at a terminal end of the multi-thiol compound, a metal oxide particulate(s), or a combination thereof.

In an embodiment, the polymer matrix may include a cross-linked polymer and a dispersing agent (e.g., (carboxylic acid group-containing) binder polymer). In an embodiment, the polymer matrix may not include a conjugated polymer (excepting cardo resin). The cross-linked polymer may include a thiolene resin, a cross-linked poly(meth)acrylate, or a combination thereof. In an embodiment, the cross-linked polymer may be a polymerization product of the polymerizable monomer and, optionally, the multi-thiol compound.

The cadmium-free quantum dot, the dispersing agent, or the binder polymer, the polymerizable monomer, and the multi-thiol compound are the same as described herein.

The aforementioned quantum dot-polymer composite may have a shape of a film or a sheet. The film of the quantum dot-polymer composite or the quantum dot-polymer composite pattern that will be described herein may have for example a thickness of less than or equal to about 30 micrometers (μm), for example less than or equal to about 25 μm, less than or equal to about 20 μm, less than or equal to about 15 μm, less than or equal to about 10 μm, less than or equal to about 8 μm, less than or equal to about 7 μm and greater than about 2 μm, for example, greater than or equal to about 3 μm, greater than or equal to about 3.5 μm, or greater than or equal to about 4 μm. The film or sheet may have a thickness of less than or equal to about 1,000 μm, for example, less than or equal to about 900 μm, less than or equal to about 800 μm, less than or equal to about 700 μm, less than or equal to about 600 μm, less than or equal to about 500 μm, or less than or equal to about 400 μm. The film or sheet may have a thickness of greater than or equal to about 10 μm, greater than or equal to about 50 μm, or greater than or equal to about 100 μm.

In an embodiment, a patterned film includes a repeating section including a first section emitting first light, wherein the first section includes the aforementioned quantum dot-polymer composite. The repeating section may include a second section emitting a second light having different wavelength of maximum emission peak wavelength from that of the first light, wherein the second section may include a quantum dot-polymer composite. The quantum dot-polymer composite of the second section may include a second quantum dot configured to emit the second light. The second quantum dot may include the aforementioned cadmium-free quantum dot. The first light or the second light may be red light having a maximum emission peak wavelength which is present between about 600 nm and about 650 nm (e.g., about 620 nm to about 650 nm) or green light having a maximum emission peak wavelength which is present between about 500 nm and about 550 nm (e.g., about 510 nm to about 540 nm). The patterned film may further include a third section emitting or passing third light (e.g., blue light) different from the first light and the second light. The third light may have a maximum peak wavelength ranging from about 380 nm to about 480 nm.

In an embodiment, a display device includes a light source and a light emitting element, and the light emitting element includes a substrate and a light emitting layer disposed on the substrate, and the light emitting layer includes a film or patterned film of the quantum dot-polymer composite. The light source is configured to provide light emitting element with incident light. The incident light may have a photoluminescence emission peak wavelength of greater than or equal to about 440 nm, for example, greater than or equal to about 450 nm, and less than or equal to about 500 nm, for example, less than or equal to about 490 nm, less than or equal to about 480 nm, less than or equal to about 470 nm, or less than or equal to about 460 nm.

In the light emitting layer (e.g., patterned film of quantum dot-polymer composite) of the device according to an embodiment, the first section may be a section emitting red light, and the second section may be a section emitting green light, and the light source may be an element emitting blue light.

Optical elements for blocking (e.g., reflecting or absorbing) blue light (blue light blocking layer or first optical filter which will be described herein) may be disposed on front surfaces (light-emitting surfaces) of the first section and the second section.

In the aforementioned display device, the light source may include a plurality of light emitting units respectively corresponding to the first section and the second section, and the light emitting units may include a first electrode and a second electrode facing each other, and an electroluminescent layer disposed between the first electrode and the second electrode. The electroluminescence layer may include an organic light emitting material. For example, each light emitting unit of the light source may include an electroluminescent device (e.g., an organic light emitting diode (OLED)) configured to emit light of a predetermined wavelength (e.g., blue light, green light, or a combination thereof). Structures and materials of the electroluminescent device and the organic light emitting diode (OLED) are not particularly limited. The light source includes an organic light emitting diode (OLED) emitting blue light (and optionally, green light).

Figure 2:
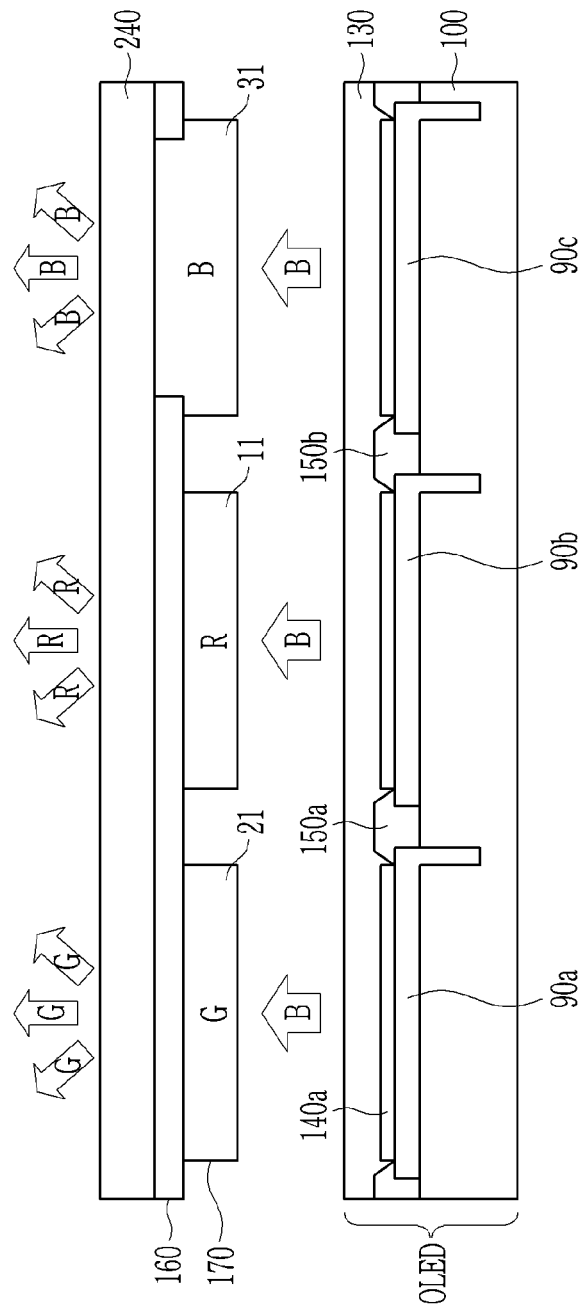
FIG. 2 is a schematic view showing a cross-section of a device according to an embodiment.
Figure 3:
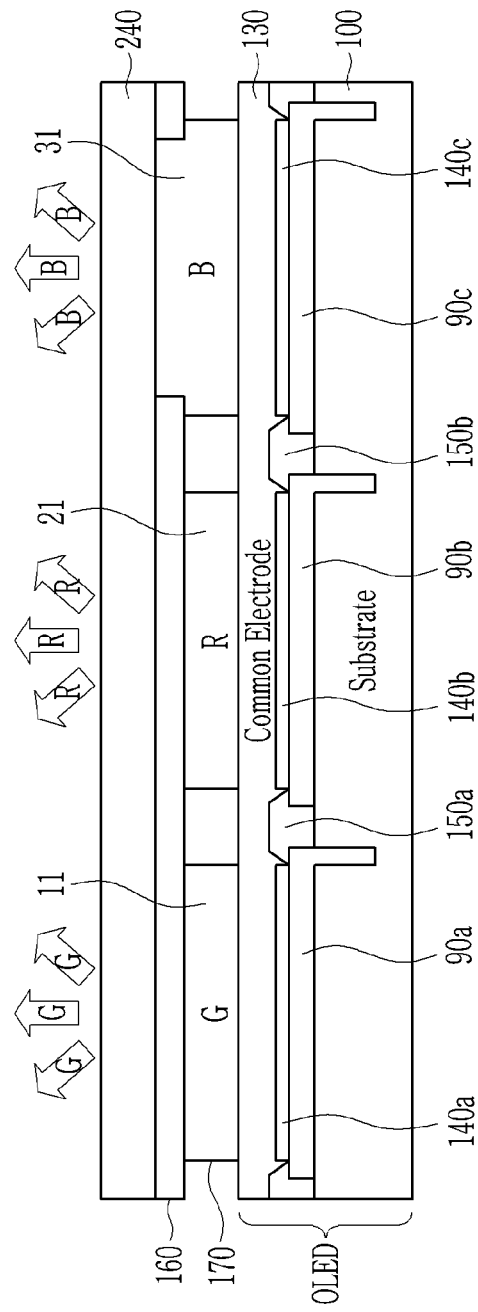
FIG. 3 is a schematic view showing a cross-section of a device according to an embodiment.

FIGS. 2 and 3 are schematic cross-sectional views of display devices according to embodiments. Referring to FIGS. 2 and 3, a light source includes an organic light emitting diode (OLED) emitting blue light. The organic light emitting diode (OLED) may include at least two pixel electrodes formed on the substrate, a pixel define layer formed between the adjacent pixel electrodes, an organic light emitting layer formed on each pixel electrode, and a common electrode layer formed on the organic light emitting layer. A thin film transistor and a substrate may be disposed under the organic light emitting diode (OLED).

A stacked structure including a quantum dot-polymer composite (e.g., first section including red quantum dot and second section including green quantum dot) pattern and a substrate may be disposed on the light source. Blue light emitted from the light source enters the first section and the second section to emit red light and green light, respectively. Blue light emitted from the light source may pass through the third section.

The device may be obtained by separately manufacturing the aforementioned stacked structure and for example, a blue light emitting LED or OLED and then assembling the same. The device may be obtained by forming a quantum dot-polymer composite pattern directly on the LED or OLED.

The substrate may be a substrate including an insulating material. The substrate may include glass; various polymers such as a polyester, for example, polyethylene terephthalate (PET) or polyethylene naphthalate (PEN), a polycarbonate, and a polyacrylate; a polysiloxane (e.g., polydimethylsiloxane (PDMS)); an inorganic material such as $Al_2O_3$ or ZnO; or a combination thereof, but is not limited thereto. A thickness of the substrate may be appropriately selected taking into consideration a substrate material but is not particularly limited. The substrate may have flexibility. The substrate may have a transmittance of greater than or equal to about 50%, greater than or equal to about 60%, greater than or equal to about 70%, greater than or equal to about 80%, or greater than or equal to about 90% for light emitted from the quantum dot.

A wire layer including a thin film transistor or the like is formed on the substrate. The wire layer may further include a gate line, a sustain voltage line, a gate insulating layer, a data line, a source electrode, a drain electrode, a semiconductor, a protective layer, and the like. The detailed structure of the wiring layer may vary depending on the implementation. The gate line and the sustain voltage line are electrically separated from each other, and the data line is insulated and crossing the gate line and the sustain voltage line. The gate electrode, the source electrode, and the drain electrode form a control terminal, an input terminal, and an output terminal of the thin film transistor, respectively. The drain electrode is electrically connected to the pixel electrode that will be described herein.

The pixel electrode may function as an anode of the display device. The pixel electrode may be formed of a transparent conductive material such as indium tin oxide (ITO) or indium zinc oxide (IZO). The pixel electrode may be formed of a material having a light-blocking properties such as gold (Au), platinum (Pt), nickel (Ni), tungsten (W), chromium (Cr), molybdenum (Mo), iron (Fe), cobalt (Co), copper (Cu), palladium (Pd), or titanium (Ti). The pixel electrode may have a two-layered structure in which the transparent conductive material and the material having light-blocking properties are stacked sequentially.

Between two adjacent pixel electrodes, a pixel define layer (PDL) overlapped with a terminal end of the pixel electrode to divide the pixel electrode into a pixel unit. The pixel define layer is an insulation layer which may electrically block the at least two pixel electrodes.

The pixel define layer covers a part of the upper surface of the pixel electrode, and the remaining region of the pixel electrode not covered by the pixel define layer may provide an opening. An organic light emitting layer that will be described herein may be formed on the region defined by the opening.

The organic light emitting layer defines each pixel area by the pixel electrode and the pixel define layer. In other words, one pixel area may be defined as an area formed with one organic emission unit layer which is contacted with one pixel electrode divided by the pixel define layer.

For example, in the display device according to an embodiment, the organic light emitting layer may be defined as a first pixel area, a second pixel area and a third pixel area, and each pixel area is spaced apart from each other leaving a predetermined interval by the pixel define layer.

In an embodiment, the organic light emitting layer may emit a third light belong to a visible light region or an ultraviolet (UV) region. That is, each of the first to the third pixel areas of the organic light emitting layer may emit third light. In an embodiment, the third light may be a light having the highest energy in the visible light region, for example, may be blue light. When all pixel areas of the organic light emitting layer are designed to emit the same light, each pixel area of the organic light emitting layer may all be formed of the same or similar materials or may show the same or similar properties. Thus, a process difficulty of forming the organic light emitting layer may be relieved, and the display device may be easily applied for, e.g., in, a large scale/large area process. However, the organic light emitting layer according to an embodiment is not limited thereto, but the organic light emitting layer may be designed to emit at least two different lights.

The organic light emitting layer includes an organic emission unit layer in each pixel area, and the, e.g., each, organic emission unit layer may further include an auxiliary layer, for example, a hole injection layer, a hole transport layer, an electron transport layer, in addition to the light emitting layer.

The common electrode may function as a cathode of the display device. The common electrode may be formed of a transparent conductive material such as indium tin oxide (ITO) or indium zinc oxide (IZO). The common electrode may be formed on the organic light emitting layer and may be integrated therewith.

A planarization layer or a passivation layer (not shown) may be formed on the common electrode. The planarization layer may include a (e.g., transparent) insulating material for ensuring electrical insulation with the common electrode.

In an embodiment, the display device may further include a lower substrate, a polarizing plate disposed under the lower substrate, and a liquid crystal layer disposed between the stack structure and the lower substrate, and in the stack structure, the light emitting layer may be disposed to face the liquid crystal layer. The display device may further include a polarizer between the liquid crystal layer and the light emitting layer. The light source may further include LED and if desired, a light guide panel.

Figure 4:
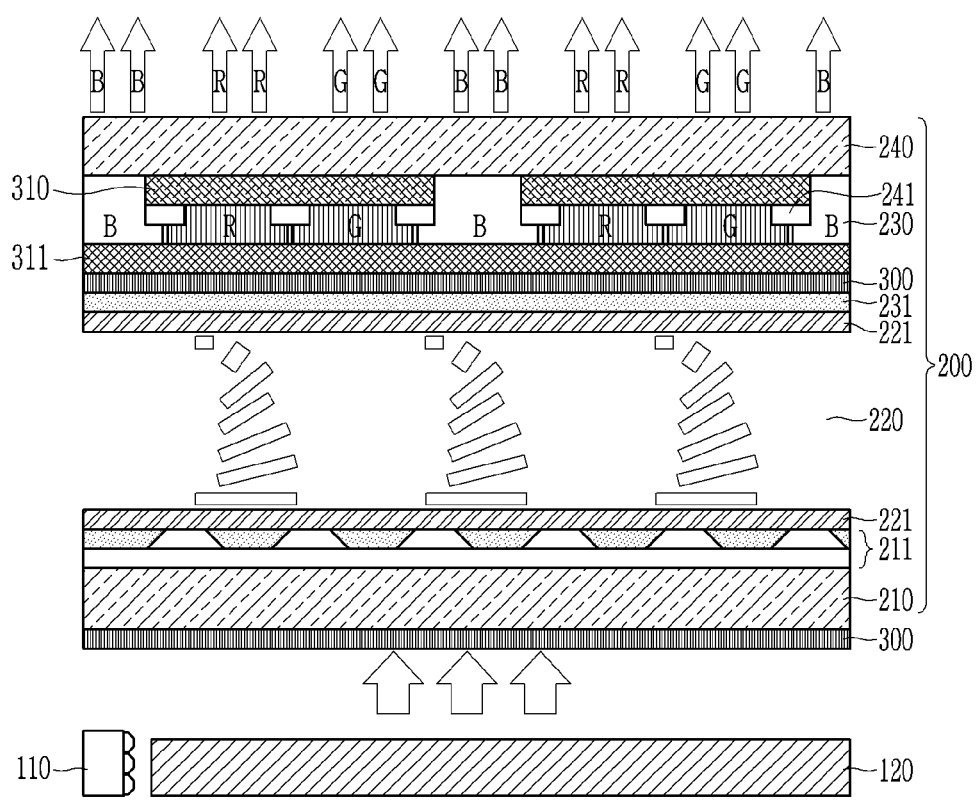
FIG. 4 is a schematic view showing a cross-section of a device according to an embodiment.

Non-limiting examples of the display device, for example, a liquid crystal display device according to an embodiment are illustrated with a reference to the drawing. FIG. 4 is a schematic cross sectional view showing a liquid crystal display according to an embodiment. Referring to FIG. 4, the display device of an embodiment includes a liquid crystal panel 200, a polarizer 300 disposed under the liquid crystal panel 200, and a backlight unit (BLU) disposed under the polarizer 300.

The liquid crystal panel 200 includes a lower substrate 210, a stacked structure, and a liquid crystal layer 220 disposed between the stack structure and the lower substrate. The stacked structure includes a transparent substrate 240 and a light emitting layer 230 including a pattern of a quantum dot-polymer composite.

The lower substrate 210 that is also referred to as an array substrate may be a transparent insulating material substrate. The substrate is the same as described herein. A wire plate 211 is provided on an upper surface of the lower substrate 210. The wire plate 211 may include a plurality of gate wires (not shown) and data wires (not shown) that define a pixel area, a thin film transistor disposed adjacent to a crossing region of gate wires and data wires, and a pixel electrode for each pixel area, but is not limited thereto. Details of such a wire plate are not particularly limited.

The liquid crystal layer 220 may be disposed on the wire plate 211. The liquid crystal layer 220 may include an alignment layer 221 on and under the layer 220 to initially align the liquid crystal material included therein. Details (e.g., a liquid crystal material, an alignment layer material, a method of forming liquid crystal layer, a thickness of liquid crystal layer, or the like) of the liquid crystal material and the alignment layer are not particularly limited.

A lower polarizer 300 is provided under the lower substrate. Materials and structures of the polarizer 300 are not particularly limited. A backlight unit (e.g., emitting blue light) may be disposed under the polarizer 300. An upper optical element or an upper polarizer 300 may be provided between the liquid crystal layer 220 and the transparent substrate 240, but is not limited thereto. For example, the upper polarizer may be disposed between the liquid crystal layer 220 and the light emitting layer 230. The polarizer may be any suitable polarizer that used in a liquid crystal display device. The polarizer may be TAC (triacetyl cellulose) having a thickness of less than or equal to about 200 µm, but is not limited thereto. In an embodiment, the upper optical element may be a coating that controls a refractive index without a polarization function.

The backlight unit includes a light source 110. The light source may emit blue light or white light. The light source may include a blue LED, a white LED, a white OLED, or a combination thereof, but is not limited thereto.

The backlight unit may further include a light guide panel 120. In an embodiment, the backlight unit may be an edge-type lighting. For example, the backlight unit may include a reflector (not shown), a light guide panel (not shown) provided on the reflector and providing a planar light source with the liquid crystal panel 200, an, e.g., at least one, optical sheet (not shown) on the light guide panel, for example, a diffusion plate, a prism sheet, and the like, or a combination thereof, but is not limited thereto. In an embodiment, the backlight unit may not include a light guide panel. In an embodiment, the backlight unit may be a direct lighting. For example, the backlight unit may have a reflector (not shown), and may have a plurality of fluorescent lamps disposed on the reflector at regular intervals, or may have an LED operating substrate on which a plurality of light emitting diodes may be disposed, a diffusion plate thereon, and optionally an, e.g., at least one, optical sheet. Details (e.g., each component of a light emitting diode, a fluorescent lamp, light guide panel, various optical sheets, and a reflector) of such a backlight unit are not particularly limited.

A black matrix 241 is provided under the transparent substrate 240 and has openings and hides a gate line, a data line, and a thin film transistor of the wire plate on the lower substrate. For example, the black matrix 241 may have a lattice shape. The light emitting layer 230 is provided in the openings of the black matrix 241 and has a quantum dot-polymer composite pattern including a first section (R) configured to emit first light (e.g., red light), a second section (G) configured to emit second light (e.g., green light), and a third section (B) configured to emit/transmit, for example blue light. If desired, the light emitting layer may further include a, e.g., at least one, fourth section. The fourth section may include a quantum dot that emits different color from light emitted from the first to third sections (e.g., cyan, magenta, and yellow light).

In the light emitting layer 230, sections forming a pattern may be repeated corresponding to pixel areas formed on the lower substrate. A transparent common electrode 231 may be provided on the photoluminescent color filter layer.

The third section (B) configured to emit/transmit blue light may be a transparent color filter that may not change an emission spectrum of the light source. Blue light emitted from the backlight unit may enter in a polarized state and may be emitted through the polarizer and the liquid crystal layer as is. If desired, the third section may include a quantum dot emitting blue light.

If desired, the display device may further include a light blocking layer (blue cut filter) or a first optical filter layer. The blue light blocking layer may be disposed between bottom surfaces of the first section (R) and the second section (G) and the upper substrate 240 or on a top surface of the upper substrate 240. The blue light blocking layer may include a sheet having openings that correspond to a pixel area showing a blue color (e.g., third section) and may be formed on portions corresponding to the first and second sections. As shown in FIG. 4, the first optical filter layer may be integrally formed as one body structure at the remaining positions except positions overlapped with the third section, but is not limited thereto. At least two first optical filter layers may be spaced apart and be disposed on each of the positions overlapped with the first and the second sections.

For example, the first optical filter layer may block light having a part of a wavelength region in the visible light region and transmit light having other wavelength regions. For example, the first optical filter layer may block blue light and transmit light except blue light. For example, the first optical filter layer may transmit green light, red light, and/or yellow light that is mixed light thereof.

For example, the first optical filter layer may substantially block blue light having a wavelength of less than or equal to about 500 nm and may transmit light in other visible light wavelength region of greater than about 500 nm and less than or equal to about 700 nm.

For example, the first optical filter layer may have light transmittance of greater than or equal to about 70%, greater than or equal to about 80%, greater than or equal to about 90%, or about 100% with respect to the other visible light of greater than about 500 nm and less than or equal to about 700 nm.

The first optical filter layer may include a polymer thin film including a dye and/or a pigment that absorbs light having a wavelength to be blocked. The first optical filter layer may block at least 80%, or at least 90%, at least 95% of blue light having a wavelength of less than or equal to about 480 nm and may have light transmittance of greater than or equal to about 70%, greater than or equal to about 80%, greater than or equal to about 90%, or about 100% with respect to other visible light of greater than about 500 nm and less than or equal to about 700 nm.

The first optical filter layer may block (e.g., absorb) and substantially block blue light having a wavelength of less than or equal to about 500 nm and for example may selectively transmit green light or red light. At least two first optical filter layers may be spaced apart and disposed on each of the portions overlapped with the first and second sections, respectively. For example, a first optical filter layer selectively transmitting red light may be disposed on the portion overlapped with the section emitting red light and the first optical filter layer selectively transmitting green light may be disposed on the portion overlapped with the section emitting green light, respectively.

For example, the first optical filter layer may include a first region, a second region, or a combination thereof, wherein the first region blocks (e.g., absorb) blue light and red light and transmits light having a wavelength of a predetermined range (e.g., greater than or equal to about 500 nm, greater than or equal to about 510 nm, or greater than or equal to about 515 nm and less than or equal to about 550 nm, less than or equal to about 545 nm, less than or equal to about 540 nm, less than or equal to about 535 nm, less than or equal to about 530 nm, less than or equal to about 525 nm, or less than or equal to about 520 nm) and the second region blocks (e.g., absorb) blue light and green light and transmits light having a wavelength of a predetermined range (e.g., greater than or equal to about 600 nm, greater than or equal to about 610 nm, or greater than or equal to about 615 nm and less than or equal to about 650 nm, less than or equal to about 645 nm, less than or equal to about 640 nm, less than or equal to about 635 nm, less than or equal to about 630 nm, less than or equal to about 625 nm, or less than or equal to about 620 nm). The first region may be disposed at a place overlapped with the section emitting green light and the second region may be disposed at a place overlapped with the section emitting red light. The first region and the second region may be optically isolated. The first optical filter (layer) may contribute to improving color purity of a display device.

The first optical filter layer may be a reflective filter including a plurality of layers (e.g., inorganic material layers) with different refractive index. For example two layers having different refractive index may be alternately stacked with each other, or for example a layer having a high refractive index and a layer having a low refractive index may be alternately stacked with each other.

The display device may further include a second optical filter layer (e.g., red/green or yellow light recycling layer) disposed between the light emitting layer and the liquid crystal layer (e.g., between light emitting layer and upper polarizer) and transmitting at least a portion of the third light and reflecting at least a portion of the first light and the second light. The second optical filter layer may reflect light in a wavelength region of greater than about 500 nm. The first light may be red light, the second light may be green light, and the third light may be blue light.

In an embodiment, the aforementioned stacked structure may be produced by a method using the photoresist composition. The method may include
  forming a film of the composition on a substrate;
  exposing a selected region of the film to light (e.g., a wavelength of less than or equal to about 400 nm); and
  developing the exposed film with an alkali developing solution to obtain a pattern of the quantum dot-polymer composite.

Figure 5:
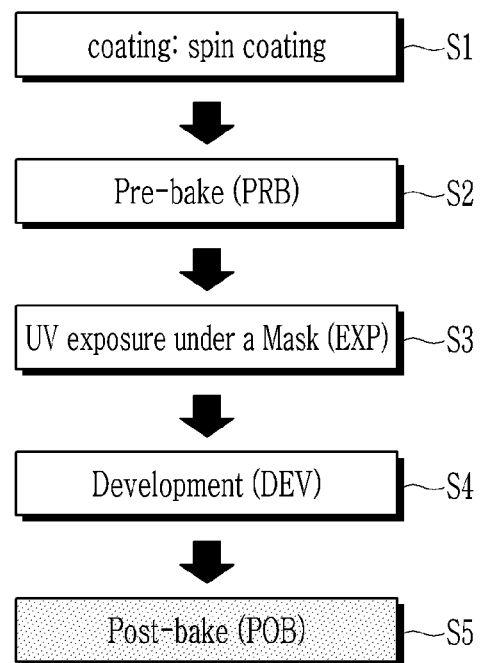
FIG. 5 is a schematic view showing a pattern forming process using a composition according to an embodiment.
Figure 5:
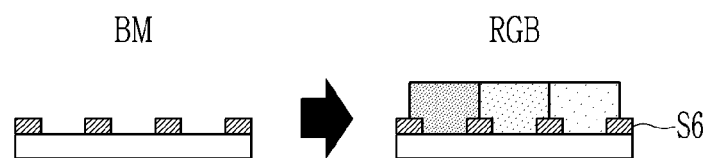

The substrate and the composition are the same as described herein. Non-limiting methods of forming the pattern are illustrated, referring to FIG. 5.

The composition is coated to have a predetermined thickness on a substrate in an appropriate method of spin coating, slit coating, and the like. The formed film may be, optionally, pre-baked (PRB). The pre-baking may be performed by selecting an appropriate condition from conditions of a temperature, time, an atmosphere, and the like.

The formed (or optionally pre-baked) film is exposed to light having a predetermined wavelength under a mask having a predetermined pattern. A wavelength and intensity of the light may be selected taking into consideration types and amounts of the photoinitiator, types and amounts of the quantum dots, and the like.

The exposed film is treated with an alkali developing solution, for example, using dipping or spraying to dissolve an unexposed region and obtain a desired pattern. The obtained pattern may be, optionally, post-baked (POB) to improve crack resistance and solvent resistance of the pattern, for example, at about 150° C. to about 230° C. for a predetermined time (e.g., greater than or equal to about 10 minutes or greater than or equal to about 20 minutes).

When the quantum dot-polymer composite pattern has a plurality of repeating sections, a quantum dot-polymer composite having a desired pattern may be obtained by preparing a plurality of compositions including a quantum dot, for example, a red light emitting quantum dot, a green quantum dot, or optionally, a blue quantum dot having desired photoluminescence properties (a photoluminescence emission peak wavelength and the like) to form each repeating section and multiple times, for example, twice or more or three times or more repeating a formation of the pattern about, e.g., for, each composition. For example, the quantum dot-polymer composite may have a pattern in which at least two different color sections (e.g., RGB color sections) are repeated. The quantum dot-polymer composite pattern may be used as a photoluminescence type color filter in a display device.

In an embodiment, the aforementioned stack structure may be produced using an ink composition. The method may include depositing the composition to provide a desirable pattern on the desirable substrate using an appropriate system, for example, a droplet discharging device such as inkjet or nozzle printing device and heating the same to remove a solvent and to perform a polymerization. The method may provide a highly precise quantum dot-polymer composite film or pattern in a simple way for a short time.

An embodiment provides an electronic device including the aforementioned quantum dot. The device may include a light emitting diode (LED), an organic light emitting diode (OLED), a sensor, a solar cell, an imaging sensor, or a liquid crystal display (LCD), but is not limited thereto.

Hereinafter, the embodiments are illustrated in more detail with reference to examples. However, they are exemplary examples of the present disclosure, and the present disclosure is not limited thereto.

EXAMPLES

Analysis Methods
1. Ultraviolet-Visible (UV-Vis) Spectroscopy
  An ultraviolet (UV) spectroscopy analysis is performed using an Agilent Cary 5000 spectrometer to obtain an UV-Visible absorption spectrum.
2. Photoluminescence (PL) Analysis
  A photoluminescence (PL) spectrum of a produced quantum dot at a wavelength of 450 nanometers (nm) is obtained using a Hitachi F-7000 spectrometer.
3. Inductively Coupled Plasma Atomic Emission Spectroscopy (ICP-AES)
  An inductively coupled plasma atomic emission spectroscopy (ICP-AES) is performed using Shimadzu ICPS-8100.

4. Absolute Quantum Efficiency (Quantum Yield (QY)) of Quantum Dot

Quantum efficiency is obtained by dividing the number of photons emitted along with photoluminescence from a sample by the number of photons absorbed by the sample. The quantum efficiency is measured with respect to the quantum dot dispersion or a quantum dot-polymer composite by using HAMAMATSU-Quantaurus-QY, C11347 (Hamamatsu Corp.).

Synthesis is performed in an inert gas atmosphere (under nitrogen flowing conditions) unless otherwise described.

Preparation of InP and InZnP Cores

Preparation Example 1: Preparation of InP Core

Indium acetate and palmitic acid are dissolved in 1-octadecene in a 200 milliliter (mL) reaction flask, and the solution is heated at 120° C. under vacuum. A mole ratio of indium and palmitic acid is at 1:3. After 1 hour, the atmosphere in the reactor is changed to nitrogen. After heating the reactor at 280° C., a mixed solution of tris(trimethylsilyl) phosphine (TMS3P) and trioctylphosphine is rapidly injected thereinto, and the mixture is reacted for 20 minutes. The reaction solution is rapidly cooled down to room temperature, acetone is added thereto, the mixture is centrifuged to obtain a precipitate, and the precipitate is redispersed in toluene. An amount of TMS3P is 0.5 moles per 1 mole of indium. An InP core obtained therefrom has a size of about 3 nm.

Preparation Example 2: Preparation of InZnP Core

An InZnP core is produced according to the same method as Preparation Example 1 except that about 1 mole of zinc acetate, based on 1 mole of the indium precursor, is further included and reacted. The obtained InZnP core has a size of about 2 nm.

Green Quantum Dot

Example 1

1. Quantum Dot Synthesis and Characteristics Analysis (1) Selenium, sulfur, and tellurium are respectively dispersed in trioctylphosphine (TOP) to produce an Se/TOP stock solution, an S/TOP stock solution, and a Te/TOP stock solution.

In a 200 mL reaction flask, 0.6 millimoles (mmol) of zinc acetate and 1.2 mmol of palmitic acid are dissolved in 10 mL of trioctylamine and then, vacuum-treated at 120° C. for 10 minutes. After internally substituting the reaction flask with $N_2$, while the solution is heated up to 320° C., toluene dispersion of the InZnP semiconductor nanocrystal synthesized in Preparation Example 2 is rapidly added thereto, and then, the Se/TOP stock solution and the Te/TOP stock solution in each predetermined amount are added thereto and then, reacted for 30 minutes to form a ZnSeTe layer on the core.

Subsequently, at the above reaction temperature, the S/TOP stock solution along with zinc acetate is added to the reaction solution and then, reacted for 30 minutes to obtain a reaction solution including an InZnP/ZnSeTe/ZnS quantum dot having a ZnS layer formed on the ZnSeTe layer.

An excess amount of ethanol is added to reactants including the InZnP/ZnSeTe/ZnS quantum dot and then, centrifuged. After the centrifugation, a supernatant is discarded, and precipitates therefrom are dried and then, dispersed in chloroform or toluene to obtain an InZnP/ZnSeTe/ZnS quantum dot solution (hereinafter, a QD solution).

An Se precursor and an S precursor used for forming the shell are used in each amount of 0.2 moles and 0.17 moles, respectively, and Te is used in an amount of 0.005 moles, based on 1 mole of Se. In addition, a Zn precursor is used in an amount of 0.6 moles.

Figure 6:
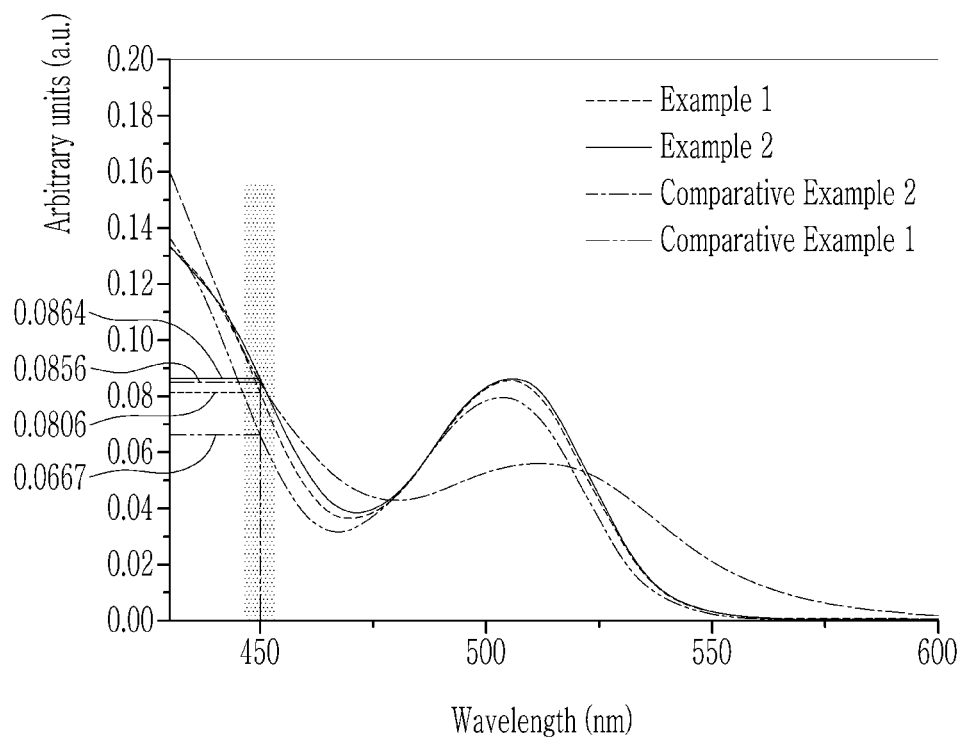
FIG. 6 is a graph of absorption (arbitrary units (a.u.)) versus wavelength (nm) showing ultraviolet-visible (UV-Vis) absorption spectra of the quantum dots produced in Example 1 and Example 2, and Comparative Example 1 and Comparative Example 2.

(2) A UV-Vis spectroscopic analysis of the obtained QD is performed, and the results are shown in FIG. 6. In addition, luminescence properties of the obtained QD are analyzed, and the results are shown in Table 2.

2. Production of Quantum Dot-Polymer Composite and Pattern Thereof (1) Preparation of Quantum Dot-Binder Dispersion The obtained quantum dot chloroform dispersion is mixed with a binder (a quaternary copolymer of methacrylic acid, benzyl methacrylate, hydroxyethyl methacrylate, and styrene, an acid value: 130 milligrams of potassium hydroxide per gram (mg KOH/g), a molecular weight: 8,000 grams/mole, methacrylic acid:benzyl methacrylate:hydroxyethyl methacrylate:styrene (mole ratio)=61.5 mole percent (mol %):12 mol %:16.3 mol %:10.2 mol %) solution (polypropylene glycol monomethyl ether acetate at a concentration of 30 weight percent (wt %)) to prepare quantum dot-binder dispersion.

(2) Preparation of Photosensitive Composition

The quantum dot binder dispersion is mixed with hexaacrylate having the following structure as a photopolymerizable monomer, glycol-di-3-mercaptopropionate (hereinafter, 2T), an oxime ester compound as an initiator, $TiO_2$ as metal oxide particulates, and propylene glycol monomethyl ether acetate (PGMEA) to prepare a composition.

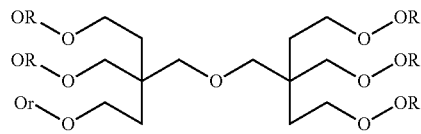

wherein

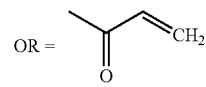

The composition includes 40 wt % of the quantum dot, 12.5 wt % of the binder polymer, 25 wt % of 2T, 12 wt % of the photopolymerizable monomer, 0.5 wt % of the initiator, and 10 wt % of the metal oxide particulates based on a solid content weight of the composition, and a total solid content thereof is 25 wt %.

(3) Production of Quantum Dot-Polymer Composite Pattern and Heat Treatment

Each photosensitive composition is spin-coated on a glass substrate at 150 revolutions per minute (rpm) for 5 seconds to obtain films. The films are pre-baked (PRB) at 100° C. These pre-baked films are exposed to irradiation of light (wavelength: 365 nm, intensity: 100 millijoules (mJ)) for 1 second under a mask having a predetermined pattern (e.g., a square dot or a stripe pattern), developed in a potassium hydroxide aqueous solution (concentration: 0.043%) for 50 seconds to obtain quantum dot-polymer composite patterns (thickness: 6 micrometers (μm)).

The obtained patterns are post-baked (POB) at 180° C. for 30 minutes under a nitrogen atmosphere.

A light emitting wavelength and an absorption for blue light of the obtained film patterns are measured, and the results are shown in Table 2.

Example 2

1. An InZnP/ZnSeTe/ZnS quantum dot is produced according to the same method as Example 1 except that a ZnSeTe layer is formed on the InZnP core synthesized in Preparation Example 2 by using 0.01 moles of Te, based on 1 mole of Se.

An ICP-AES analysis of the obtained QD is performed, and the results are shown in Table 1, and a UV-Vis spectroscopic analysis thereof is performed, and the results are shown in FIG. 6. In addition, luminescence properties of the obtained QD are analyzed, and the results are shown in Table 2.

2. A quantum dot-polymer composite pattern is obtained according to the same method as Example 1 except that the obtained quantum dot is used. A light emitting wavelength and an absorption for blue light of the obtained film are measured, and the results are shown in Table 2.

TABLE 1

| | Relative mole ratio | | | | | |
| --- | --- | --- | --- | --- | --- | --- |
| | Zn:In | P:In | S:In | Se:In | Te:In | Te:Se |
| Example 2 | 35:1 | 1.0:1 | 11:1 | 19:1 | 0.2:1 | 0.0105:1 |

Comparative Example 1

1. An InZnP/ZnSe/ZnS quantum dot (QD) is produced according to the same method as Example 1 except that the Te/TOP stock solution is not added to the toluene dispersion of the InZnP semiconductor nanocrystal synthesized in Preparation Example 2, but the Se/TOP stock solution alone is added thereto to form a ZnSe layer on the InZnP core, and then, the S/TOP stock solution is added thereto.

A UV-vis spectroscopic analysis of the obtained QD is performed, and the results are shown in FIG. 6. In addition, a photoluminescence property analysis of the obtained QD is performed, and the results are shown in Table 2.

2. A quantum dot-polymer composite pattern is obtained according to the same method as Example 1 except that the obtained quantum dot is used. A light emitting wavelength, an absorption for blue light, and photo-conversion efficiency of the obtained film are measured, and the results are shown in Table 2.

Comparative Example 2

1. An InZnP/ZnSeTe/ZnS quantum dot is produced according to the same method as Example 1 except that a shell is formed on the InZnP semiconductor nanocrystal core synthesized in Preparation Example 2 by using 0.025 moles of Te, based on 1 mole of Se.

A UV-vis spectroscopic analysis of the obtained QD is performed, and the results are shown in FIG. 6. In addition, a photoluminescence property analysis of the obtained QD is performed, and the results are shown in Table 2.

2. A quantum dot-polymer composite pattern is obtained according to the same method as Example 1 except that the obtained quantum dot is used. A light emitting wavelength and an absorption for blue light of the obtained film are measured, and the results are shown in Table 2.

TABLE 2

| | InZnP/ZnSe(Te)/ZnS quantum dot | | | Photoresist (PR) single film | | |
| --- | --- | --- | --- | --- | --- | --- |
| | PL Peak (nm) | Full Width at Half Maximum (FWHM) (nm) | Absolute QY (%) | Thickness (μm) | Wavelength (nm) | Blue absorption (%) |
| Example 1 | 528 | 37 | 92.7 | 5.85 | 541.3 | 89.6 |
| Example 2 | 529 | 38 | 91.7 | 5.8 | 540.5 | 90.6 |
| Comparative Example 2 | 542 | 80 | 61.7 | 5.79 | 642.3 | 91.0 |
| Comparative Example 1 | 528 | 39 | 93.8 | 5.54 | 538.8 | 87.5 |

As shown in FIG. 6, the quantum dot obtained by doping 0.005 moles of Te relative to 1 mole of Se in a semiconductor nanocrystal shell according to Example 1 and the quantum dot obtained by doping 0.010 moles of Te relative to 1 mole of Se according to Example 2 exhibit higher absorption rates at 450 nm than that of the quantum dot not obtained by doping Te according to Comparative Example 1, and in addition, as shown in Table 2, when blue absorption rates of quantum dot-polymer composite films formed thereof are measured, the quantum dot-polymer composite films exhibit higher blue absorption rates than a quantum dot-polymer composite film formed of the quantum dot according to Comparative Example 1.

On the other hand, the quantum dot including 0.025 moles of Te relative to 1 mole of Se according to Comparative Example 2, as shown in FIG. 6, exhibits almost equally high blue absorption to that of the quantum dot according to Example 2, and as shown in Table 2, a composite film formed thereof exhibits a higher blue absorption than that of a composite film formed of the quantum dot according to Example 2. However, the quantum dot according to Comparative Example 2, as shown in FIG. 6, exhibits a shifted absorption peak wavelength of a UV-Vis absorption spectrum toward a longer wavelength compared with an absorption wavelength of the quantum dot including no Te according to Comparative Example 1, and in addition, as shown in Table 2, single films formed of the quantum dots according to Comparative Example 1 and Examples 1 and 2 also exhibit shifted light emitting wavelengths toward the longer wavelength. In other words, since Te is included in an amount of 2.5 mol %, the blue absorption of the quantum dot is increased, but the light emitting wavelength (optical characteristics) thereof is changed. In addition, the quantum dots according to Examples 1 and 2 maintain almost as high absolute quantum efficiency as that of the quantum dot including no Te according to Comparative Example 1, but the quantum dot including 2.5 mol % of Te according to Comparative Example 2 exhibits absolute quantum efficiency of 61.7%, which is lower than that of the quantum dots according to Examples 1 and 2 or Comparative Example 1.

In conclusion, when 0.025 moles of Te relative to 1 mole of Se is included in a shell, a quantum dot exhibiting an increased absorption for blue light, maintaining high quantum efficiency, but having no light emitting wavelength change and a quantum dot-polymer composite including the same may be obtained.

Example 3

An InZnP/ZnSeTe/ZnS quantum dot is produced according to the same method as Example 1 except that a shell is formed on the InZnP semiconductor nanocrystal core synthesized in Preparation Example 2 by adding the Se-TOP stock solution and the S/TOP stock solution to include 0.18 moles of Se, 0.5 moles of S, and 0.022 moles of Te, based on 1 mole of Se.

Figure 7:
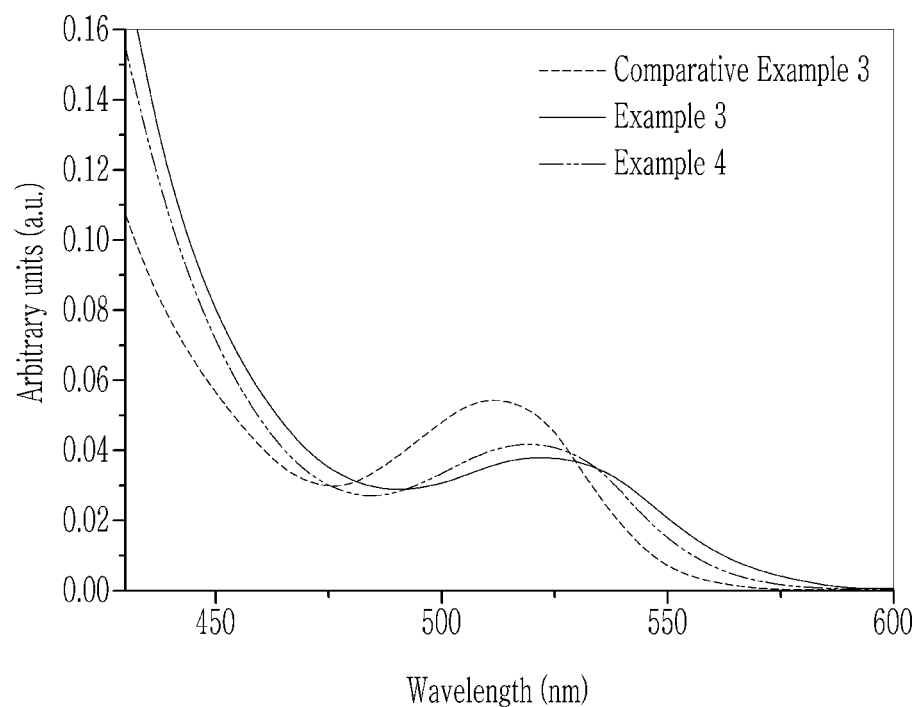
FIG. 7 is a graph of absorption (a.u.) versus wavelength (nm) showing UV-Vis absorption spectra of the quantum dots produced in Example 3 and Example 4, and Comparative Example 3.

A UV-vis spectroscopic analysis of the obtained QD is performed, and the results are shown in FIG. 7.

Example 4

An InZnP/ZnSeTe/ZnS quantum dot is produced according to the same method as Example 3 except that a shell is formed on the InZnP semiconductor nanocrystal core of Preparation Example 2 by using 0.011 moles of Te, based on 1 mole of Se.

A UV-vis spectroscopic analysis of the obtained QD is performed, and the results are shown in FIG. 7.

Comparative Example 3

An InZnP/ZnSe/ZnS quantum dot is produced according to the same method as Comparative Example 1 except that the contents of Se and S in the shell are the same as those of Example 3. In other words, the quantum dot includes SE and S respectively in the contents, e.g., amounts, of 0.18 moles and 0.5 moles but no Te in the shell.

A UV-vis spectroscopic analysis of the obtained QD is performed, and the results are shown in FIG. 7.

Referring to FIG. 7, the quantum dot including 0.022 moles of Te relative to 1 mole of Se in the shell according to Example 3 and the quantum dot including 0.011 moles of Te relative to 1 mole of Se according to Example 4 exhibit a much higher blue absorption rate, that is, a much higher absorption at 450 nm than the quantum dot including no Te according to Comparative Example 3. In other words, even though the shell has a different ratio of Se and S from those of Examples 1 and 2 and is much thinner than those thereof, the same blue absorption change effect depending on a ratio of Te to Se in the shell is obtained.

Example 5

An InZnP/ZnSeTe/ZnS quantum dot is produced according to the same method as Example 1 except that a shell is formed on the InZnP semiconductor nanocrystal core of Preparation Example 2 by using 0.14 moles of Se and 0.17 moles of S and 0.02 moles of Te, based on 1 mole of Se.

Figure 8:
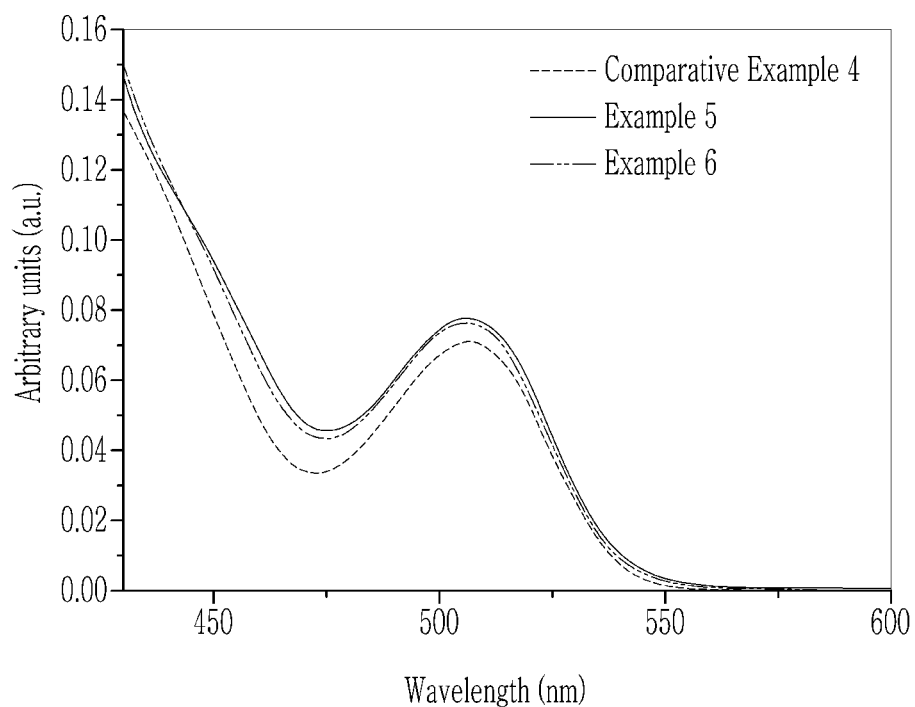
FIG. 8 is a graph of absorption (a.u.) versus wavelength (nm) showing UV-Vis absorption spectra of the quantum dots produced in Example 5 and Example 6 and Comparative Example 4.

A UV-vis spectroscopic analysis of the obtained QD is performed, and the results are shown in FIG. 8. In addition, a quantum dot-polymer composite pattern is obtained according to the same method as Example 1 except that the above quantum dot is used. A light emitting wavelength and an absorption for blue light of the obtained film are measured, and the results are shown in Table 3.

Example 6

An InZnP/ZnSeTe/ZnS quantum dot is produced according to the same method as Example 1 except that a shell is formed on the InZnP semiconductor nanocrystal core of Preparation Example 2 by including 0.14 moles of Se and 0.17 moles of S and 0.02 moles of Te, based on 1 mole of Se, and after forming a ZnSe layer on the core and in addition, before adding zinc acetate and the S/TOP stock solution, the Te/TOP stock solution corresponding to 0.02 moles of Te, based on 1 mole of Se is added along with the zinc acetate.

A UV-vis spectroscopic analysis of the obtained QD is performed, and the results are shown in FIG. 8. In addition, a quantum dot-polymer composite pattern is obtained according to the same method as Example 1 except that the above quantum dot is used. A light emitting wavelength and an absorption for blue light of the obtained film are measured, and the results are shown in Table 3.

Comparative Example 4

A core/shell quantum dot is produced according to the same method as Comparative Example 1 except that contents of Se and S in the shell are the same as in those of Example 5. In other words, the contents, e.g., amounts, of Se and S in the shell are respectively 0.14 moles and 0.17 moles, but Te is not included in the InZnP/ZnSe/ZnS quantum dot.

A UV-vis spectroscopic analysis of the obtained QD is performed, and the results are shown in FIG. 8. In addition, a quantum dot-polymer composite pattern is obtained according to the same method as Example 1 except that the above quantum dot is used. An emission wavelength, an absorption for blue light, and photo-conversion efficiency of the obtained film are measured, and the results are shown in Table 3.

TABLE 3

| | PR single film result | | |
|---|---|---|---|
| | Thickness (μm) | Wavelength (nm) | Absorption (%) |
| Comparative Example 4 | 6.2 | 541 | 90.2 |
| Example 5 | 6.1 | 542 | 91.9 |
| Example 6 | 6.2 | 541 | 91.5 |

Referring to FIG. 8, the quantum dot of Example 5 having a ZnSeTe layer formed by adding 0.02 moles of Te relative to 1 mole of Se along with the zinc precursor and the selenium precursor and the quantum dot of Example 6 doped with the same amount of Te but having a ZnSe layer formed by not adding the Te precursor along with the zinc precursor and the selenium precursor but first adding the zinc precursor and the selenium precursor alone to form a ZnSe layer and then, adding the Te precursor later to form a ZnSeTe layer thereon all exhibit high absorption rates at a wavelength of 450 nm compared with the quantum dot of Comparative Example 4 having a shell not doped with Te. In other words, the Te doping may improve a blue absorption rate, regardless of being performed along with forming the ZnSe layer or after forming the ZnSe layer, when a mole ratio of Te to Se is less than 0.025:1.

In addition, referring to Table 3, quantum dot-polymer composite films respectively including the quantum dots according to Examples 5 and 6 exhibit a higher blue absorption than the quantum dot-polymer composite film including the quantum dot of Comparative Example 4. In addition, the quantum dot-polymer composite films of Examples 5 and 6 exhibit similar blue absorption rates, but the quantum dot having a ZnSe layer and doped with Te according to Example 5 exhibits a little higher efficiency and blue absorption rate.

On the other hand, the quantum dot-polymer composite films including the quantum dots according to Examples 5 and 6 exhibit almost the same emission wavelengths as the quantum dot-polymer composite film including the quantum dot including no Te in the shell according to Comparative Example 4. In other words, the quantum dots respectively including less than 0.025:1 mole ratio of Te to Se in the shells according to Examples 5 and 6 may effectively improve absorption rates for blue light without photoluminescence property changes. Since the quantum dots exhibit a higher absorption about excitation light, when included in the same contents, display devices manufactured by using the quantum dot-polymer composites according to Examples 5 and 6 may exhibit excellent luminescence properties.

Referring to the results, as a quantum dot including a semiconductor nanocrystal core including a Group III-V compound and a semiconductor nanocrystal shell surrounding the core and including zinc, selenium, and tellurium, a cadmium-free quantum dot including the mole ratio of tellurium to selenium in a range of less than 0.025:1 maintains high quantum efficiency as well as improves an absorption for blue light. The quantum dot having the improved absorption for blue light and quantum efficiency may have an effect of improving luminescence properties of a display device including the same.

While this disclosure has been described in connection with what is presently considered to be practical embodiments, it is to be understood that the invention is not limited to the disclosed embodiments. On the contrary, it is intended to cover various modifications and equivalent arrangements included within the spirit and scope of the appended claims.

What is claimed is:

1. A quantum dot, comprising
   a core comprising a first semiconductor nanocrystal comprising a Group III-V compound; and
   a semiconductor nanocrystal shell disposed on the core, the semiconductor nanocrystal shell comprising zinc, tellurium, and selenium,
   wherein the quantum dot does not comprise cadmium, and
   wherein the semiconductor nanocrystal shell has a mole ratio of tellurium to selenium of less than about 0.025:1.

2. The quantum dot of claim 1, wherein the semiconductor nanocrystal shell has a mole ratio of tellurium to selenium of less than or equal to about 0.02:1.

3. The quantum dot of claim 1, wherein the semiconductor nanocrystal shell has a mole ratio of tellurium to selenium of greater than or equal to about 0.005:1.

4. The quantum dot of claim 1, wherein the semiconductor nanocrystal shell has a composition that changes in a radial direction.

5. The quantum dot of claim 1, wherein the semiconductor nanocrystal shell comprises a first layer disposed directly on the core, and an outer layer disposed on the first layer, and
   wherein the first layer comprises a second semiconductor nanocrystal and the outer layer has a different composition from the second semiconductor nanocrystal.

6. The quantum dot of claim 5, wherein the second semiconductor nanocrystal comprises zinc and selenium, and the outer layer comprises
   zinc, and
   sulfur, selenium, or a combination thereof.

7. The quantum dot of claim 6, wherein the second semiconductor nanocrystal further comprises tellurium, and the outer layer comprises sulfur, and
   wherein a concentration of tellurium in the semiconductor nanocrystal shell decreases in a direction toward a surface of the quantum dot, and a concentration of sulfur increases in a direction toward the surface of the quantum dot.

8. The quantum dot of claim 5, wherein the outer layer comprises a first outer layer disposed directly on the first layer and an outermost layer of the quantum dot, and
   wherein the first outer layer comprises a third semiconductor nanocrystal comprising zinc and selenium, and the outermost layer comprises a fourth semiconductor nanocrystal comprising zinc and sulfur and no selenium.

9. The quantum dot of claim 8, wherein the third semiconductor nanocrystal further comprises tellurium.

10. The quantum dot of claim 1, wherein the core comprises indium and phosphorus.

11. The quantum dot of claim 10, wherein the core further comprises zinc.

12. The quantum dot of claim 10, wherein the quantum dot has an emission peak wavelength in a range of about 500 nanometers to about 550 nanometers, and a mole ratio of tellurium to indium is greater than or equal to about 0.1:1.

13. The quantum dot of claim 12, wherein a quantum efficiency of the quantum dot is greater than or equal to about 58% and a full width at half maximum of a photoluminescence emission peak of the quantum dot is less than or equal to about 45 nanometers.

14. The quantum dot of claim 1, wherein the quantum dot has an emission peak wavelength in the range of about 600 nanometers to about 650 nanometers and a mole ratio of tellurium to indium is greater than or equal to about 0.01:1.

15. The quantum dot of claim 14, wherein a quantum efficiency of the quantum dot is greater than or equal to about 70% and a full width at half maximum of a photoluminescence emission peak of the quantum dot is less than about 45 nanometers.

16. The quantum dot of claim 1, wherein the quantum dot comprises RCOOH, RNH$_2$, R$_2$NH, R$_3$N, RSH, RH$_2$PO, R$_2$HPO, R$_3$PO, RH$_2$P, R$_2$HP, R$_3$P, ROH, RCOOR, RPO(OH)$_2$, RPOOH, RHPOOH, R$_2$POOH, wherein R is the same or different and is independently a substituted or unsubstituted C1 to C40 aliphatic hydrocarbon, a substituted or unsubstituted C6 to C40 aromatic hydrocarbon, or a combination thereof, provided that at least one R is not hydrogen, or a combination thereof, on a surface thereof.

17. A composition comprising
    a plurality of the quantum dots of claim 1,
    a dispersing agent, a polymerizable monomer comprising a carbon-carbon unsaturated bond, and
an initiator.

18. The composition of claim 17, wherein the dispersing agent is a polymer comprising a carboxylic acid group, the polymer comprising
a copolymer of a monomer mixture comprising a first monomer comprising a carboxylic acid group and a carbon-carbon double bond, a second monomer comprising a carbon-carbon double bond and a hydrophobic moiety and not comprising a carboxylic acid group, and optionally a third monomer comprising a carbon-carbon double bond and a hydrophilic moiety and not comprising a carboxylic acid group;
a multiple aromatic ring-containing polymer having a backbone structure in which two aromatic rings are bound to a quaternary carbon atom that is a constituent atom of another cyclic moiety in the main chain and comprising a carboxylic acid group (—COOH); or
a combination thereof.

19. The composition of claim 17, wherein the composition further comprises a multi-thiol compound comprising at least two thiol groups at a terminal end of the multi-thiol compound, metal oxide particulates, or a combination thereof.

20. The composition of claim 19, wherein the metal oxide particulates comprise $TiO_2$, $SiO_2$, $BaTiO_3$, $Ba_2TiO_4$, $ZnO$, or a combination thereof.

21. The composition of claim 19, wherein the multi-thiol compound comprises a compound represented by Chemical Formula 1:

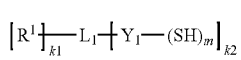

Chemical Formula 1 wherein, in Chemical Formula 1,
$R^1$ is hydrogen; a substituted or unsubstituted C1 to C30 linear or branched alkyl group; a substituted or unsubstituted C6 to C30 aryl group; a substituted or unsubstituted C3 to C30 heteroaryl group; a substituted or unsubstituted C3 to C30 cycloalkyl group; a substituted or unsubstituted C3 to C30 heterocycloalkyl group; a C1 to C10 alkoxy group; a hydroxy group; —$NH_2$; a substituted or unsubstituted C1 to C30 amine group; an isocyanate group; a halogen; —ROR', wherein R is a substituted or unsubstituted C1 to C20 alkylene group and R' is hydrogen or a C1 to C20 linear or branched alkyl group; an acyl halide; —C(=O)OR', wherein R' is hydrogen or a C1 to C20 linear or branched alkyl group; —CN; —C(=O)ORR' or —C(=O)ONRR', wherein R and R' are independently hydrogen or a C1 to C20 linear or branched alkyl group, $L_1$ is a carbon atom, a substituted or unsubstituted C1 to C30 alkylene group, a substituted or unsubstituted C1 to C30 alkylene group wherein at least one methylene is replaced by a sulfonyl, a carbonyl, an ether, a sulfide, a sulfoxide, an ester, an amide, or a combination thereof, a substituted or unsubstituted C3 to C30 cycloalkylene group, a substituted or unsubstituted C6 to C30 arylene group, a substituted or unsubstituted C3 to C30 heteroarylene group, or a substituted or unsubstituted C3 to C30 heterocycloalkylene moiety, $Y_1$ is a single bond; a substituted or unsubstituted C1 to C30 alkylene group; a substituted or unsubstituted C2 to C30 alkenylene group; or a C1 to C30 alkylene group or a C2 to C30 alkenylene group wherein at least one methylene is replaced by a sulfonyl, a carbonyl, an ether, a sulfide, a sulfoxide, an ester, an amide, an imine, or a combination thereof, m is an integer of 1 or greater,
k1 is an integer of 0 or 1 or greater,
k2 is an integer of 1 or greater,
a sum of m and k2 is an integer of 3 or greater,
m does not exceed a valence of $Y_1$, and
a sum of k1 and k2 does not exceed a valence of $L_1$.

22. A quantum dot-polymer composite comprising
a polymer matrix; and
a plurality of the quantum dots of claim 1 dispersed in the polymer matrix,
wherein the polymer matrix comprises a binder polymer, a polymerization product of a photopolymerizable monomer comprising at least one carbon-carbon double bond, and optionally a polymerization product between the photopolymerizable monomer and a multi-thiol compound comprising at least two thiol groups at a terminal end of the multi-thiol compound.

23. A patterned layer comprising
a repeating section configured to emit light in a predetermined wavelength,
wherein the repeating section comprises the quantum dot-polymer composite of claim 22.

24. The patterned layer of claim 23, wherein the repeating section comprises a first section configured to emit red light, a second section configured to emit green light, or a combination thereof.

25. A display device comprising a light source and a light emitting element,
wherein the light emitting element comprises a substrate, and the patterned layer of claim 23 disposed on the substrate, and
wherein the light source is configured to provide the light emitting element with incident light.

26. The display device of claim 25, wherein the incident light has an emission peak wavelength of about 440 nanometers to about 460 nanometers.

* * * * *